United States Patent
Yamaoka et al.

(10) Patent No.: US 11,367,818 B2
(45) Date of Patent: Jun. 21, 2022

(54) METHOD OF MANUFACTURING LIGHT-EMITTING DEVICE

(71) Applicant: NICHIA CORPORATION, Anan (JP)

(72) Inventors: Kensuke Yamaoka, Tokushima (JP); Masaki Nagao, Anan (JP)

(73) Assignee: NICHIA CORPORATION, Anan (JP)

( * ) Notice: Subject to any disclaimer, the term of this patent is extended or adjusted under 35 U.S.C. 154(b) by 116 days.

(21) Appl. No.: 17/028,614

(22) Filed: Sep. 22, 2020

(65) Prior Publication Data

US 2021/0098668 A1    Apr. 1, 2021

(30) Foreign Application Priority Data

Sep. 27, 2019   (JP) ............................. JP2019-177209
Dec. 16, 2019   (JP) ............................. JP2019-226607
Jun. 3, 2020    (JP) ............................. JP2020-097056

(51) Int. Cl.
| | |
|---|---|
| *H01L 33/60* | (2010.01) |
| *H01L 25/075* | (2006.01) |
| *H01L 33/52* | (2010.01) |
| *G02F 1/13357* | (2006.01) |
| *F21K 9/68* | (2016.01) |
| *H01L 33/62* | (2010.01) |

(52) U.S. Cl.
CPC .............. *H01L 33/60* (2013.01); *F21K 9/68* (2016.08); *G02F 1/133603* (2013.01); *G02F 1/133608* (2013.01); *H01L 25/0753* (2013.01); *H01L 33/52* (2013.01); *H01L 33/62* (2013.01); *H01L 2924/171* (2013.01); *H01L 2933/005* (2013.01); *H01L 2933/0058* (2013.01)

(58) Field of Classification Search
CPC ......... G02F 1/133608; G02F 1/133603; H01L 2924/171; H01L 33/58; H01L 33/60; H01L 25/0753; H01L 2933/0058; F21K 9/68
See application file for complete search history.

(56) References Cited

U.S. PATENT DOCUMENTS

| | | | |
|---|---|---|---|
| 2006/0139772 A1 | 6/2006 | Watanabe et al. | |
| 2006/0291076 A1 | 12/2006 | Watanabe et al. | |
| 2010/0265598 A1 | 10/2010 | Watanabe et al. | |

(Continued)

FOREIGN PATENT DOCUMENTS

| | | |
|---|---|---|
| JP | 2006-184780 A | 7/2006 |
| JP | 2010-191345 A | 9/2010 |

(Continued)

*Primary Examiner* — Feifei Yeung Lopez
(74) *Attorney, Agent, or Firm* — Foley & Lardner LLP

(57) ABSTRACT

A method of manufacturing a light-emitting device includes: mounting a light-emitting element on a mounting board; placing a light-shielding frame on a sheet, the light-shielding frame defining an opening and comprising at least one narrow portion having a width that is smaller than that of another portion of the light-shielding frame in a top view; applying a light-reflective resin on at least the narrow portion of the light-shielding frame; forming a light-guiding supporting member; and bonding the second surface of a light-transmissive member of the light-guiding supporting member to an upper surface of the light-emitting element so as to fix the light-guiding supporting member on or above the light-emitting element.

7 Claims, 15 Drawing Sheets

(56) References Cited

U.S. PATENT DOCUMENTS

2017/0155022 A1\*  6/2017  Tomonari .............. H01L 33/647
2019/0165218 A1   5/2019  Nakai et al.
2019/0302350 A1  10/2019  Yamaoka et al.

FOREIGN PATENT DOCUMENTS

| JP | 2014-127679 A | 7/2014 |
| JP | 2015-187624 A | 10/2015 |
| JP | 2019-102614 A | 6/2019 |
| JP | 2019-186513 A | 10/2019 |

\* cited by examiner

METHOD OF MANUFACTURING LIGHT-EMITTING DEVICE

CROSS-REFERENCE TO RELATED APPLICATIONS

This application claims priority to Japanese Patent Application No. 2019-177209, filed on Sep. 27, 2019, and Japanese Patent Application No. 2019-226607, filed on Dec. 16, 2019, and Japanese Patent Application No. 2020-097056, filed on Jun. 3, 2020, the disclosures of which are hereby incorporated by reference in their entireties.

BACKGROUND

The present disclosure relates to a method of manufacturing a light-emitting device.

High-output light-emitting devices including light-emitting elements such as LEDs are increasingly used as light sources for vehicles and the like in recent years. For example, Japanese Patent Publication No. 2014-127679 discloses a high-output light-emitting device used as a light source for a vehicle in which a heat dissipation layer is formed to cover the periphery of the light-emitting surface of a light-emitting element to increase the heat dissipation effect.

SUMMARY

An object of certain embodiments of the present disclosure is to provide a simple method of manufacturing a light-emitting device in which a difference in luminance between the inside and the outside of the light exit surface is large, and light emitted from a light-emitting element can be efficiently extracted.

According to an embodiment of the present disclosure, a method of manufacturing a light-emitting device includes: mounting a light-emitting element on a mounting board; placing a light-shielding frame on a sheet, the light-shielding frame defining an opening; applying a light-reflective resin on the light-shielding frame; forming a light-guiding supporting member comprising: providing a light-transmissive member having a plate shape and having a first surface and a second surface opposite to and larger than the first surface, the first surface having an outer perimeter being smaller than an inner perimeter of the opening; disposing the light-transmissive member such that the first surface faces a sheet at a position at which a gap is formed between the light-transmissive member and the light-shielding frame, forming a first light-reflective member by bringing the light-transmissive member into contact with the light-reflecting resin applied on the light-shielding frame, and pressing the light-transmissive member to allow the light-reflective resin to flow into the gap, so that the light-guiding supporting member in which the light-shielding frame and a light-transmissive member are supported by the light-reflective member is formed; and bonding a light-guiding supporting member to fix the light-guiding supporting member on or above the light-emitting element such that the second surface is bonded to an upper surface of the light-emitting element. The light-shielding frame has a narrow portion having a small width in a top view. In the light-reflective resin application step, the light-reflective resin is disposed at least on the narrow portion.

According to certain embodiments of the present disclosure, it is possible to manufacture, in a simple manner, a light-emitting device in which a difference in luminance between the inside and the outside of the light exit surface is large, and light emitted from a light-emitting element can be efficiently extracted.

BRIEF DESCRIPTION OF THE DRAWINGS

FIG. 11 is a schematic perspective view showing a combination of the light-shielding frame and light-transmissive member as partially seen through.

DETAILED DESCRIPTION OF EMBODIMENTS

Figure 1:
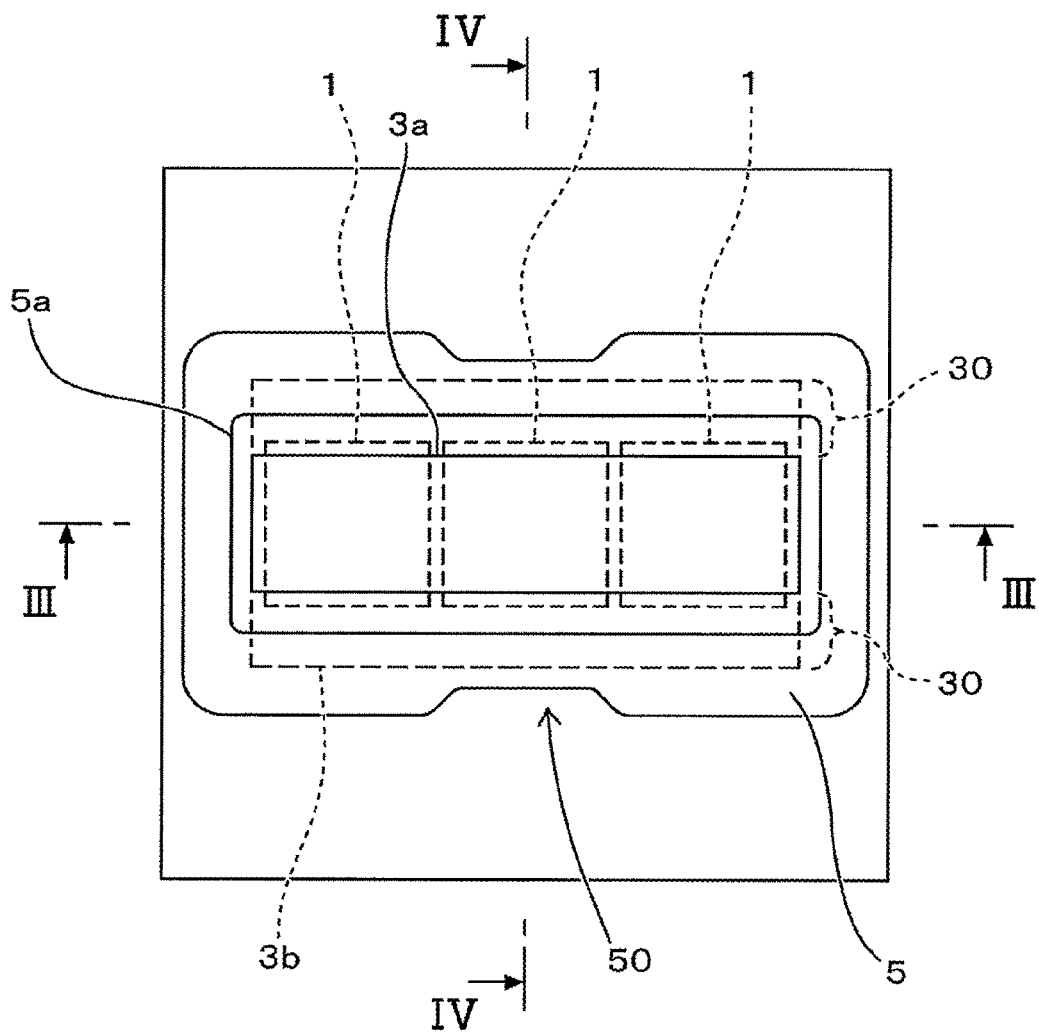
FIG. 1 is a schematic illustrative top view of a light-emitting device according to an embodiment.

In a manufacturing method according to an embodiment of the present disclosure, a mounting board on which at least one light-emitting element is mounted and a light-guiding supporting member in which a light-shielding frame and a light-transmissive member are supported by a first light-reflective member are first provided.

The light-guiding supporting member is formed by providing the plate-shaped light-transmissive member having a first surface and a second surface opposite to and larger than the first surface, placing the light-shielding frame provided with an opening on a sheet, and placing the light-transmissive member inside the opening such that a gap is left between the light-transmissive member and the light-shielding frame. When the light-transmissive member is placed, its flange (more specifically, the flange attributable to the structure in which the second surface is larger than the first surface) presses a light-reflective resin provided over the light-shielding frame to allow the light-reflective resin to flow into the gap between the light-transmissive member and the light-shielding frame.

The light-guiding supporting member provided as described above is fixed to the light-emitting element mounted on the mounting board, and a second light-reflective member surrounding the light-emitting element is then formed.

With such a method, in the case in which a plurality of light-emitting devices are manufactured, the light-guiding supporting member in which the light-shielding frame and the light-transmissive member are supported by the first light-reflective member can be placed on each of a plurality of unit regions of a mounting board on which light-emitting elements have been mounted, so that light-emitting devices can be more efficiently manufactured in a simpler manner.

In a light-emitting device obtained by such a method, the first light-reflective member is disposed between the first surface (i.e., the light exit surface of the light-emitting device) of the light-transmissive member and the light-shielding frame in a top view. The light-shielding frame increases the difference in luminance between the inside and the outside of the light exit surface, but has the property of absorbing light, therefore, direct contact between the light-transmissive member and the light-shielding frame may reduce the light extraction efficiency of the light-emitting device. In the light-emitting device of the present embodiment, the reduction in light extraction efficiency is inhibited by the "first light-reflective member disposed between the light-transmissive member and the light-shielding frame." This can provide a light-emitting device in which a difference in luminance between the inside and the outside of the light exit surface is large, and which has suitable optical properties in which reduction in light extraction efficiency is inhibited.

The manufacturing method according to the embodiment of the present disclosure employs a light-shielding frame having a narrow portion having a small width in a top view, so that residual voids (bubbles) can be prevented or reduced in a region of the first light-reflective member between the light-transmissive member and the light-shielding frame.

A manufacturing method according to an embodiment of the present disclosure and a light-emitting device provided by the method (hereinafter also referred to as the "light-emitting device of the present embodiment") will be described below referring to the accompanying drawings. An embodiment described below is intended to embody the technical concept of the present invention and does not limit the present invention. The drawings referred to in the description below schematically illustrate the embodiment of the present disclosure. The scales, the distances, the positional relations, and the like of members may be exaggerated, or illustration of part of the members may be omitted.

Light-Emitting Device of Embodiment

Figure 2A:
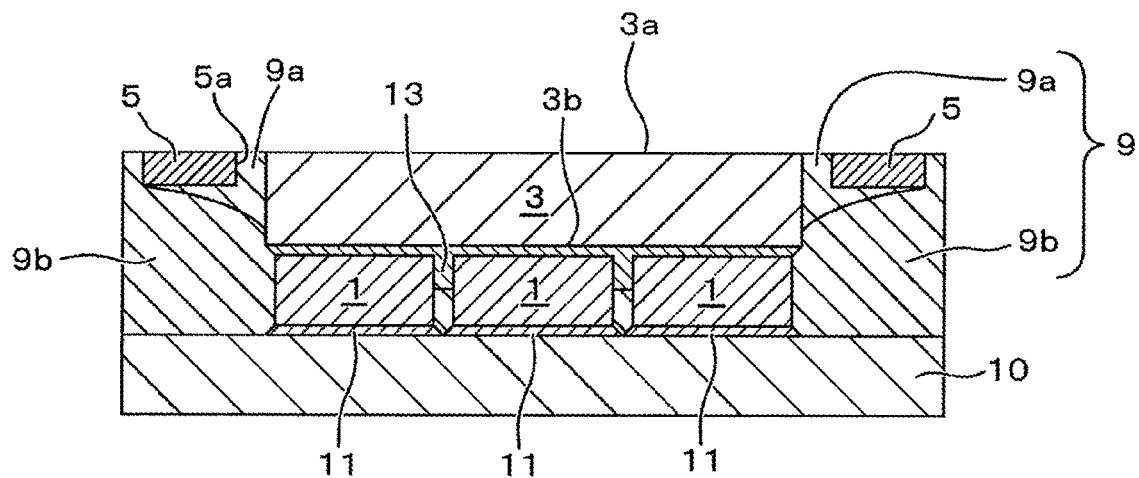
FIG. 2A is a schematic illustrative sectional view of the light-emitting device according to the embodiment taken along the line of FIG. 1.
Figure 2B:
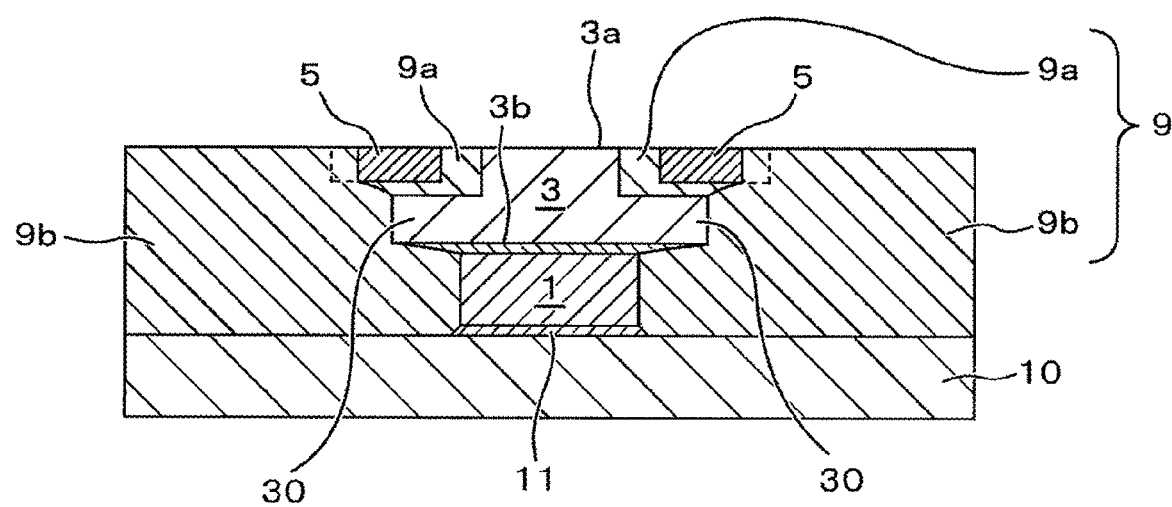
FIG. 2B is schematic illustrative sectional view of the light-emitting device according to the embodiment taken along the line IV-IV of FIG. 1.

The light-emitting device of the present embodiment includes at least a light-emitting element, a light-transmissive member, and a light-shielding frame as minimum constituent elements. As shown in FIG. 1 and FIGS. 2A and 2B, the light-emitting device includes a mounting board 10, light-emitting elements 1 disposed on the mounting board 10, a light-transmissive member 3 facing light-emitting surfaces of the light-emitting elements 1, a first light-reflective member 9a disposed over the lateral surfaces of the light-transmissive member 3, and a light-shielding frame 5 disposed in contact with the first light-reflective member 9a and surrounding the light-transmissive member 3.

More specifically, the light-emitting device includes the mounting board 10, the light-emitting elements 1 disposed on the mounting board 10, and the plate-shaped light-transmissive member 3 disposed such that a second surface 3b faces the light-emitting surfaces of the light-emitting elements 1. Further, the light-emitting device includes the first light-reflective member 9 and a second light-reflective member 9b. The first light-reflective member 9a bonds the light-shielding frame 5 to at least a portion of the lateral surfaces of the light-transmissive member 3 such that a first surface 3a of the light-transmissive member 3 serving as the light exit surface of the light-emitting device is exposed. The second light-reflective member 9b is disposed between the first light-reflective member 9a and the mounting board 10 to cover the lateral surfaces of the light-emitting elements 1. The first light-reflective member 9a and the second light-reflective member 9b may be hereinafter collectively referred to as the "light-reflective member 9."

In the light-emitting device of the present embodiment, the light-transmissive member 3 is located in an opening 5a of the light-shielding frame 5. Specifically, the light-transmissive member 3 is disposed such that the first surface 3a of the light-transmissive member 3 is located in the opening 5a of the light-shielding frame 5 with the first light-reflective member 9a therebetween. As shown in the drawings, the first surface 3a of the light-transmissive member 3 is exposed from the first light-reflective member 9a and the light-shielding frame 5. The first surface 3a of the light-transmissive member 3 can be located at substantially the same height as the upper surface of the light-shielding frame 5. That is, the first surface 3a of the light-transmissive member 3 and the upper surface of the light-shielding frame 5 are in the same plane.

In the light-emitting device of the present embodiment, in a top view (i.e., from the light exit surface of the light-emitting device), the inner perimeter of the opening 5a of the light-shielding frame 5 is located apart from the outer perimeter of the first surface 3a of the light-transmissive member 3 serving as the light exit surface of the light-emitting device, and the first light-reflective member 9a is located between the inner perimeter of the opening 5a and the outer perimeter of the first surface 3a of the light-transmissive member 3. That is, the frame part of the light-shielding frame 5 is separated from the first surface 3a of the light-transmissive member 3 with the first light-reflective member 9a therebetween. As described above, in the light-emitting device, the light-transmissive member 3 is separated from the light-shielding frame 5 by disposing the first light-reflective member 9a therebetween.

With the light-emitting device of the embodiment having the above structure, a difference in luminance between the light exit surface and the region surrounding the light exit surface can be large and light emitted from the light-emitting elements can be efficiently extracted.

In the light-emitting device of the present embodiment, the distance between the inner perimeter of the opening 5a and the outer perimeter of the first surface 3a can be 5 μm or more and 150 μm or less, for example, 40 μm or more and 60 μm or less, in order to obtain both of increase in the difference in luminance between the inside and the outside of the first surface 3a serving as the light exit surface and efficient extraction of light emitted from the light-emitting elements.

In the light-emitting device of the present embodiment, the light-shielding frame has narrow portions having small widths in a top view. Specifically, the width of the frame part of the light-shielding frame is not uniform but is locally narrowed. For example, in the case in which the light-shielding frame has a frame shape in a top view, the light-shielding frame has at least one narrow portion partially narrowed in at least one side of the rectangle shape of the frame.

Figure 3:
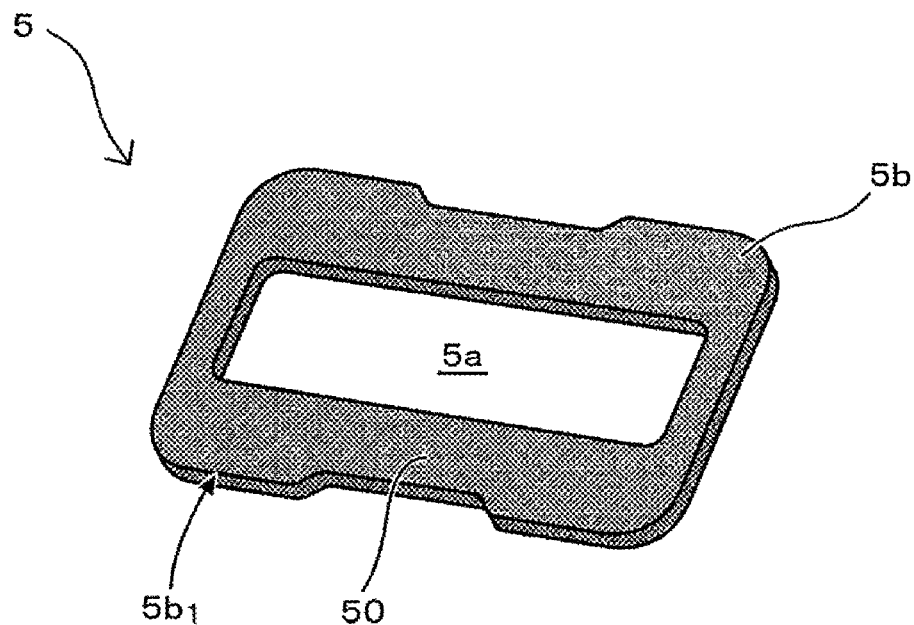
FIG. 3 is a schematic perspective view of a light-shielding frame.
Figure 4:
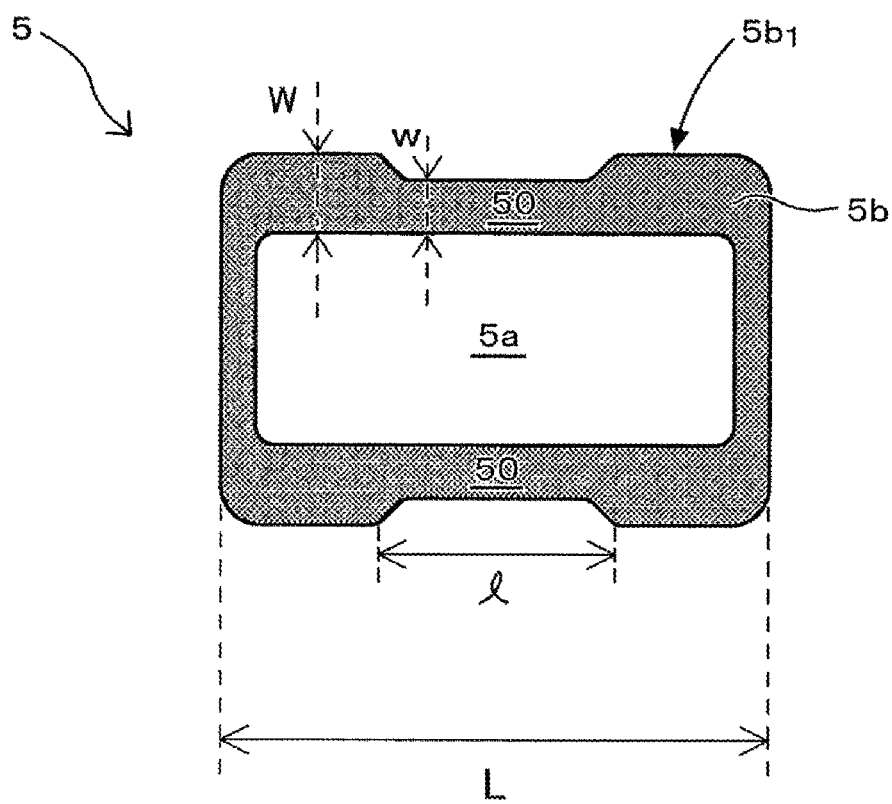
FIG. 4 is a schematic top view of the light-shielding frame shown in FIG. 3.

FIG. 3 and FIG. 4 show an example of the light-shielding frame 5 used in the present embodiment. The light-shielding frame 5 is disposed in order to reduce the luminance of the portion of the upper surface of the light-emitting device other than the light exit surface. The light-shielding frame 5 of the light-emitting device according to the present embodiment has a frame part 5b and the frame part 5b defines the opening 5a. The light-transmissive member 3 is located in the opening 5a. The frame part 5b of the light-shielding frame 5 is a region in which a light-reflective resin is applied in forming light-reflective resin in a light-guiding supporting member formation step in the manufacture, and contributes to formation of the first light-reflective member 9a.

The narrow portions 50 of the light-shielding frame 5 can contribute to the effect of prevention or reduction of generation of voids when the light-guiding supporting member is formed. In particular, by applying the light-reflective resin at least over the narrow portions 50 in a light-reflective resin application step performed before the light-guiding supporting member formation step, the light-emitting device in which residual voids (bubbles) is prevented or reduced in the region provided with the first light-reflective member 9a between the light-transmissive member 3 and the light-shielding frame 5. Although the details will be described below, if such voids are left, the inhibition of reduction in light extraction efficiency provided by the first light-reflective member disposed between the light-transmissive member and the light-shielding frame may be reduced. Also, the residual voids may reduce the bonding strength between components of the light-emitting device. More specifically, the voids in the region in which the first light-reflective member 9a is formed between the light-transmissive member 3 and the light-shielding frame 5 may lead to reduction in bonding strength between the first light-reflective member 9a and the light-transmissive member 3 and/or bonding strength between the first light-reflective member 9a and the light-shielding frame 5. The light-emitting device of the present embodiment includes the light-shielding frame 5 having one or more narrow portion 50 as a constituent feature, so that the residual voids that may cause adverse effects on the light extraction efficiency and/or bonding strength are reduced.

The narrow portions 50 are portions having relatively small lateral widths compared with other regions of the light-shielding frame 5. As shown in FIG. 4 for example, each of the narrow portions 50 is a portion having a relatively reduced width in a region of the frame elongated in one direction relative to another portion of the frame in a top view. When the light-reflective resin is applied over such a light-shielding frame, the height of a light-reflective resin 9a' disposed over the light-shielding frame 5 is not entirely uniform because of the narrow portions 50 (see FIGS. 5A and 5B). That is, the height of the light-reflective resin disposed over the light-shielding frame is locally different. With the light-reflective resin disposed over the light-shielding frame having the locally-different height, generation of voids is inhibited in forming the first light-reflective member. Specifically, the light-transmissive member is brought into contact with the light-reflective resin and pressed in the light-guiding supporting member formation step to supply the light-reflective resin in the gap between the light-transmissive member and the light-shielding frame. However, the light-transmissive member is in contact with the light-reflective resin with a time lag at the time of pressing because the height of the light-reflective resin is locally different. Such contact with a time lag can facilitate the escape of air from the gap to the outside, so that generation of voids is inhibited.

The overall structure and components of the light-emitting device of the present embodiment will be described below.

In the light-emitting device of the present embodiment, the light-transmissive member 3 has the first surface 3a, which practically serves as the light exit surface of the light-emitting device, and the second surface 3b opposite to the first surface. The area of the second surface 3b of the light-transmissive member 3 is larger than the area of the first surface 3a of the light-transmissive member 3 in a top view (see FIG. 1).

The first surface 3a of the light-transmissive member 3 having a smaller area than the second surface 3b of the light-transmissive member 3 allow light emitted from the light-emitting elements 1 incident on the second surface 3b to output from the first surface 3a having a smaller area. In other words, the area of the light-emitting surface is narrowed down through the light-transmissive member 3, so that a more distant place is illuminated at high luminance. Light-emitting devices with high front luminance are particularly suitable for vehicle lights, such as headlights. There are various regulations and standards for the colors of vehicle lights, such as a regulation or standard that the colors of light emitted from all headlights of a vehicle must be the same, and must be white or pale yellow.

The sizes of the first surface 3a and the second surface 3b of the light-transmissive member 3 are different, and the light-transmissive member 3 has a flange. Specifically, the light-transmissive member 3 has the flange because the area of the second surface 3b is larger than the area of the first surface 3a.

The outer perimeter of the second surface 3b of the light-transmissive member 3 is preferably at least partially located outward of the inner perimeter of the opening 5a of the light-shielding frame 5 in a top view. In the light-emitting device of the embodiment shown in FIG. 1, a portion (particularly at least a portion of the contour of the flange of the light-transmissive member 3) of the outer perimeter of the second surface 3b is located outward of the inner perimeter of the opening 5a in a top view. For example, in the case in which the outer perimeter of the second surface 3b of the light-transmissive member 3 has a rectangular shape, at least a side, for example two opposite sides, preferably two long sides opposite to each other, of the outer perimeter can be located outward of the inner perimeter of the opening 5a of the light-shielding frame 5.

As described above, in a suitable embodiment, a portion or the whole of the outer perimeter of the second surface 3b of the light-transmissive member 3 is located outward of the inner perimeter of the opening 5a in a top view. Also in a suitable embodiment, the outer perimeter of the first surface 3a of the light-transmissive member 3 is located inward of the inner perimeter of the opening 5a in a top view.

That is, in the light-emitting device of the present embodiment, the first surface 3a of the light-transmissive member 3 and the upper surface of the first light-reflective member 9a surrounding the outer perimeter of the first surface 3a can be seen inside the opening 5a of the light-shielding frame 5 in a top view of the light-emitting device (i.e., a view from the light exit surface of the light-emitting device). In this case, inside the opening 5a, the light-transmissive member 3 is at least partially located in the region below the first light-reflective member. With this structure, even if cracks and/or delamination are caused in the first light-reflective member 9a, light leaking out from the opening 5a is likely to be constituted by only light emitted from the light-transmissive member 3 in regard to the portion in which the light-transmissive member 3 is located inward of the opening 5a. To increase such an effect, in the case in which the outer perimeter of the second surface 3b of the light-transmissive member 3 has a rectangular shape having long sides and short sides, at least the long sides of the outer perimeter of the second surface 3b are preferably located outward of the inner perimeter of the opening 5a of the light-shielding frame 5 as described above.

Further, for example, even if cracks and/or delamination are caused in the second light-reflective member 9b located lateral side of the light-emitting elements 1, light emitted from the lateral surfaces of the light-emitting elements 1 is more effectively inhibited from being transmitted to the light exit surface through the cracks and/or delaminated portions because light leaking out from the light-reflective member 9 is blocked in the region covered with the light-shielding frame 5.

For example, in the case in which a light-emitting device that emits white light as a mixture of blue light emitted from the light-emitting elements 1 and yellow light produced by wavelength conversion of a portion of the blue light is used as a vehicle light, leakage of the blue light emitted from the light-emitting elements 1 other than the white light emitted from the light exit surface causes difference in chromaticity within the opening 5a. This may cause unevenness in emission color in an area irradiated. Further, if the leaking blue light is seen, there is a possibility of compromising safety of a vehicle and infringing or nonconformity of the above regulations or standards for vehicle lights.

In a configuration of the light-emitting device of the present embodiment, the outer perimeter of the first surface 3a of the light-transmissive member 3 is at least partially located inward of the outer perimeter of the light-emitting elements 1 in a top view (see FIG. 1). For example, in the case in which the outer perimeter of the first surface 3a of the light-transmissive member 3 has a rectangular shape, the long side(s) of the rectangular shape can be located inward of the long side(s) of the outer perimeter of the light-emitting elements 1. As shown in FIG. 1, in the case in which the light-emitting device includes a plurality of light-emitting elements 1, the outer perimeter of the light-emitting elements 1 refers to the outer perimeter of the whole of the light-emitting elements 1, and does not include portions of the outer perimeters facing each other between adjacent light-emitting elements.

With this structure, light emitted from a plurality of light-emitting elements 1 is condensed before exiting from the first surface 3a of the light-transmissive member 3. Light emitted from the light-emitting elements 1 can exit from the first surface 3a (i.e., the light exit surface of the light-emitting device) of the light-transmissive member 3 at a higher luminous flux density.

Mounting Board

The mounting board 10 is a member supporting the light-emitting elements 1 and other components, and at least its surface is provided with wiring electrically connected to external electrodes of the light-emitting elements 1. A preferable main material of the mounting board 10 is an insulating material that is unlikely to transmit light emitted from the light-emitting elements 1 and extraneous light. Specifically, for example, a ceramic such as alumina and aluminum nitride or at least one resin selected from among phenolic resins, epoxy resins, silicone resins, polyimide resins, BT resins, and polyphthalamide can be used. In the case in which a resin is used, at least one inorganic filler selected from among glass fiber, silicon oxide, titanium oxide, alumina, and the like can be mixed with the resin as appropriate. This can improve the mechanical strength and the light reflectance, and/or reduce the thermal expansion coefficient. The mounting board 10 can be a metal member provided with an insulating material on its surface. The wiring is formed into a predetermined pattern on the insulating material. The material of the wiring can be at least one selected from among gold, silver, copper, titanium, palladium, nickel, and aluminum. The wiring can be formed by plating, vapor deposition, and/or sputtering.

Light-Emitting Element

A light-emitting diode is preferably used as each light-emitting element 1. A light-emitting element 1 that emits light having appropriately selected wavelength can be used. For example, at least one selected from among nitride semiconductors ($In_XAl_YGa_{1-X-Y}N$, where $0 \le X$, $0 \le Y$, and $X+Y \le 1$), ZnSe, and GaP can be used for a blue or green light-emitting element. For a red light-emitting element, GaAlAs and/or AlInGaP can be used. Semiconductor light-emitting elements made of other materials can also be used. The composition, emission color, size, and/or number of the light-emitting elements to be used can be appropriately selected according to the purpose. In the case in which the light-emitting device contains a phosphor, a nitride semiconductor ($In_XAl_YGa_{1-X-Y}N$, where $0 \le X$, $0 \le Y$, and $X+Y \le 1$) is suitable because it can emit light with short wavelengths that can efficiently excite the phosphor. The emission wavelength can be selected by changing the materials for the semiconductor layer and/or their mixing ratio.

For example, the light-emitting element 1 used in the light-emitting device of the present embodiment includes positive and negative electrodes on the same surface. The light-emitting element 1 can be flip-chip mounted on the mounting board 10 with electrically-conductive bonding members 11 therebetween as shown in FIG. 2A. The electrically-conductive bonding members 11 connected to the positive and negative electrodes of the light-emitting element 1 are simplified in FIG. 2A, but each of the electrically-conductive bonding members 11 is actually connected to a respective one of the positive and negative electrodes disposed on the same surface. Each of the positive and negative electrodes of the light-emitting element 1 is connected to a respective one of positive and negative portions of the wiring (not shown) disposed over the mounting board 10 with the electrically-conductive bonding members 11 therebetween. The light-emitting element 1 has a lower surface provided with the electrodes and facing the mounting board, and has an upper surface opposite to the lower surface serves as the main light exit surface. Such a light-emitting element 1 is connected to the mounting board using electrically-conductive bonding members such as bumps and electrically-conductive paste as described above, so that the area of contact between the electrodes and the mounting board is large compared with the case of a light-emitting element that is connected using metal wires or the like. Accordingly the contact resistance is reduced.

The light-emitting element 1 is formed by, for example, layering a nitride semiconductor layer on a light-transmissive supporting substrate. The supporting substrate is located on the upper side of the light-emitting element 1, and serves as the main light exit surface. The supporting substrate can be removed by, for example, abrasion and/or laser lift off.

Light-Transmissive Member

The light-transmissive member 3 transmits light emitted from the light-emitting elements 1, and outputs the light to the outside. The light-transmissive member 3 has the first surface 3a, which practically serves as the light exit surface of the light-emitting device, and the second surface 3b opposite to the first surface, and the area of the second surface 3b of the light-transmissive member 3 is larger than the area of the first surface 3a of the light-transmissive member 3. As described above, the light-transmissive member 3 has flanges 30 on its lateral surfaces.

The light-transmissive member 3 can contain a light-diffusing material or a phosphor that can perform wavelength conversion of at least a portion of incident light. The light-transmissive member 3 can be made of, for example, resin, glass, and/or an inorganic substance. Examples of the light-transmissive member containing a phosphor include a sintered body of a phosphor and a mixture of a phosphor and a substance such as resin, glass, ceramics, and other inorganic substances. Alternatively, a mold or compact of resin, glass, and/or a ceramic provided with a layer containing a phosphor on its surface can be used. The overall thickness of the light-transmissive member 3 is, for example, about 50 μm to 300 μm.

The light-transmissive member 3 can be bonded to the light-emitting elements 1 using, for example, a light guide member 13 as shown in FIG. 2A. The light-transmissive member 3 can be directly bonded to the light-emitting elements 1 by compression, sintering, surface-activated bonding, atomic diffusion bonding, and/or hydroxy-group bonding without the light guide member 13.

The light-transmissive member 3 can contain a phosphor. A phosphor that can be excited by light emitted from the light-emitting elements 1 is used as the phosphor that can be contained in the light-transmissive member 3. For example, a phosphor that can be excited by a blue or ultraviolet light-emitting element can be at least one selected from among cerium-activated yttrium-aluminum-garnet based phosphors (YAG:Ce); cerium-activated lutetium-aluminum-garnet based phosphors (LAG:Ce); europium- and/or chromium-activated nitrogen-containing calcium aluminosilicate based phosphors ($CaO-Al_2O_3-SiO_2$:Eu); europium-activated silicate based phosphors (($Sr,Ba)_2SiO_4$:Eu); nitride based phosphors such as β-SiAlON based phosphors, CASN based phosphors represented by $CaAlSiN_3$:Eu, and SCASN based phosphors represented by $(Sr,Ca)AlSiN_3$:Eu; KSF based phosphors represented by $K_2SiF_6$:Mn; sulfide phosphors; and quantum-dot phosphors. A light-emitting device that emits a desired color (such as a light-emitting device that emits white light) can be manufactured by combining these phosphors and blue or ultraviolet light-emitting elements.

The light-transmissive member 3 can be what is called a "YAG plate", which is merely an example.

The light-transmissive member can have a quadrangular shape in a top view. In particular, a first surface of the light-transmissive member can have a quadrangular shape in a top view. The expression "quadrangular shape" as used herein refers to a substantially quadrangular shape and is broadly interpreted so as to imply squares, rectangles, parallelograms, and trapezoids. For example, in the case in which a plurality of light-emitting elements 1 are disposed for a single light-transmissive member, the light-transmissive member 3 can have such a quadrangular shape and size as to cover all the light-emitting elements 1.

In the case in which the first surface of the light-transmissive member has a quadrangular shape in a top view, a pair of flanges can be provided on sides opposite to each other of the quadrangular shape. That is, flanges can be provided on a set of sides opposite to each other in the quadrangular shape. For example, the first surface and a second surface of the light-transmissive member 3 can have rectangular shapes in a top view as shown in FIG. 1. In the case in which the first surface and the second surface of the light-transmissive member have rectangular shapes in a top view, a pair of flanges can be provided on long sides opposite to each other in the rectangular shape.

Light-Shielding Frame

The light-shielding frame 5 is disposed in order to reduce the luminance of the portion other than the light exit surface in the upper surface of the light-emitting device. To reduce the luminance of the portion other than the light exit surface, light leaking out from the portion other than the first surface 3a of the light-transmissive member 3 to the outside is required to be blocked. Considering this function, for example, the light-shielding frame 5 is preferably a member made of a material that reflects and/or absorbs light without transmitting light or a member provided with, on its surface, a film made of a material that reflects and/or absorbs light.

The light-shielding frame 5 used in the light-emitting device of the present embodiment includes portions in which the widths of the frame are not constant. That is, the light-shielding frame has narrow portions having locally small widths in a top view.

For example, the material constituting the light-shielding frame 5 can be selected from among resins (including fiber-reinforced resins), ceramics, glass, paper, metals, and composite materials each made of two or more of these materials. Specifically, the light-shielding frame 5 can be made of a material that has good light-blocking properties, and is unlikely to deteriorate. For example, the light-shielding frame 5 can be constituted by a metal frame made of metal or a frame provided with a metal film on its surface. Examples of the metal material include copper, iron, nickel, chromium, aluminum, gold, silver, titanium, and alloys of these metals.

The light-shielding frame 5 more preferably has the function of inhibiting reflection of extraneous light in addition to the function of inhibiting leakage of light from inside the light-emitting device. To obtain the function of inhibiting reflection of extraneous light, for example, minute irregularities (i.e., fine protrusion and/or depression) can be provided on the light exit surface, or a material with high light absorptivity can be used. The arithmetic mean roughness Ra of the minute irregularities is, for example, 0.5 µm or more and 1.0 µm or less. In the case in which the surface of the light-shielding frame has minute irregularities, wettability of the surface of the light-shielding frame by a liquid is increased, and the uncured resin material tends to spread over the surface of the light-shielding frame. Hence, for example, the minute irregularities are preferably not formed on the edges of the upper surface of the light-shielding frame. Examples of the material with high light absorptivity include black nickel plating and black chromium plating.

The thickness of the light-shielding frame 5 (i.e., the height from the lower surface to the upper surface of the light-shielding frame 5) can be about 20 µm to 200 µm, for example about 30 µm to 80 µm, in consideration of the lightweight and/or resistance to deformation as well as the strength when used in the light-emitting device.

The light-shielding frame 5 can be disposed such that its outer perimeter corresponds to the outer perimeter of the light-emitting device in a top view. Alternatively, the light-shielding frame 5 can be disposed such that its outer perimeter of the light-shielding frame 5 is located inward of the outer perimeter of the light-emitting device. This structure can inhibit misalignment and the like of the light-shielding frame 5 in a division step of dividing undivided light-emitting devices into unit regions (i.e., into individual light-emitting devices) described below because the light-shielding frame 5 is not disposed on the dividing lines.

The statement that the light-shielding frame 5 is disposed such that the outer perimeter of the light-shielding frame 5 is located inward of the outer perimeter of the light-emitting device includes the state in which the light-shielding frame 5 is disposed such that a portion of the outer perimeter of the light-shielding frame 5 is located inward of the outer perimeter of the light-emitting device.

The width of the light-shielding frame 5 in a top view can be 130 µm or more in consideration of increase in the difference in luminance between the inside and the outside of the light exit surface of the first surface 3a. In particular, the width can be, for example, 500 µm or more in consideration of the ease of handling in the manufacturing process.

Light-Reflective Member

The light-reflective member can include the first light-reflective member 9a that bonds the opening 5a of the light-shielding frame 5 to part of the lateral surfaces of the light-transmissive member 3 and the second light-reflective member 9b that is disposed between the first light-reflective member 9a and the mounting board 10 to cover the lateral surfaces of the light-emitting elements 1.

The first light-reflective member 9a and the second light-reflective member 9b cover the lateral surfaces of the light-emitting elements 1 and the lateral surfaces of the light-transmissive member 3, and reflect light emitted from the lateral surfaces of the light-emitting elements 1 and the lateral surfaces of the light-transmissive member 3 to allow the reflected light to be emitted from the first surface 3a of the light-transmissive member 3, which serves as the light exit surface of the light-emitting device. The light extraction efficiency is increased by disposing the light-reflective member 9 covering the lateral surfaces of the light-emitting elements 1 and the lateral surfaces of the light-transmissive member 3 as described above. The light-reflective member is made of, for example, a light-reflective material having a high light reflectance. Specifically, a light-reflective material having a reflectance of 60% or more, for example 80% or 90% or more with respect to light emitted from the light-emitting elements, can be used for the light-reflective member. The light-reflective material includes, for example, a resin material containing a light-reflective substance. As described below in detail, the first light-reflective member 9a and the second light-reflective member 9b are individually formed, and can be made of different light-reflective materials or the same light-reflective material.

Examples of the resin of the base material constituting the light-reflective member 9 include resins such as silicone resins, modified silicone resins, epoxy resins, modified epoxy resins, acrylic resins, and hybrid resins each containing at least one of these resins. A light-reflective substance is mixed in the base material made of the resin to form the light-reflective member 9. At least one selected from among titanium oxide, silicon oxide, zirconium oxide, magnesium oxide, yttrium oxide, yttria-stabilized zirconia, calcium carbonate, calcium hydroxide, calcium silicate, niobium oxide, zinc oxide, barium titanate, potassium titanate, magnesium fluoride, alumina, aluminum nitride, boron nitride, and mullite can be used for the light-reflective substance. For example, titanium oxide ($TiO_2$) can be used. Particles having a refractive index different from the refractive index of the base resin can be dispersed as the light-reflective substance in the base resin. The amounts of reflection and transmission of light vary according to the concentration and density of the light-reflective substance, and accordingly the concentration and/or density can be appropriately adjusted according to the shape and/or size of the light-emitting device. The light-reflective member can contain another pigment and/or phosphor in addition to the light-reflective substance. In particular, in the case in which the light-transmissive member 3 contains a phosphor, incorporating substantially the same phosphor into the second light-reflective member 9b covering the lateral surfaces of the light-emitting elements can inhibit leakage of light emitted from the light-emitting elements from being seen from the lateral surfaces of the light-emitting device.

Light Guide Member

In the light-emitting device, the light-transmissive member 3 can be bonded to the light-emitting elements 1 using the light guide member 13. The light guide member 13 can cover a portion or the whole of the lateral surfaces of the light-emitting elements 1 as shown in FIG. 2A. In the case in which a portion of the second surface 3b of the light-transmissive member 3 does not face the upper surfaces (i.e., the main light exit surfaces) of the light-emitting elements 1, the light guide member 13 can cover the portion of the light-transmissive member 3 that does not face the upper surfaces of the light-emitting elements. The light guide member 13 is also disposed between the light-emitting elements 1 and the light-transmissive member 3 to bond the light-emitting elements 1 to the light-transmissive member 3. The light guide member 13 having the above structure efficiently guides light emitted from the upper surfaces and the lateral surfaces of the light-emitting elements 1 to the light-transmissive member 3.

The light guide member 13 is preferably made of a resin material because resin materials are easy to handle and process. Examples of the resin material to be used include a resin material made of a resin or hybrid resin containing at least one selected from among silicone resins, modified silicone resins, epoxy resins, modified epoxy resins, acrylic resins, and fluorocarbon resins. The light guide member 13 can be formed into the above shape by appropriately adjusting the viscosity of the resin material constituting the light guide member 13 and/or the wettability of the light-emitting elements 1 by the resin material.

Other Members

The light-emitting device can include other elements such as a protective element and electronic components as appropriate. These elements and electronic components are preferably embedded in the light-reflective member.

Method of Manufacturing Light-Emitting Device of Embodiment

A method of manufacturing a light-emitting device according to an embodiment includes: mounting a light-emitting element on a mounting board; placing a light-shielding frame on a sheet, the light-shielding frame defining an opening and comprising at least one narrow portion having a width that is smaller than that of another portion of the light-shielding frame in a top view; applying a light-reflective resin on at least the narrow portion of the light-shielding frame; forming a light-guiding supporting member, which comprises: providing a light-transmissive member having a plate shape and having a first surface and a second surface opposite to and larger than the first surface, the first surface having an outer perimeter being smaller than an inner perimeter of the opening, disposing the light-transmissive member such that the first surface faces a sheet at a position proximate the opening, forming a first light-reflective member by bringing the light-transmissive member into contact with the light-reflecting resin applied on the light-shielding frame, and pressing the light-transmissive member to allow the light-reflective resin to flow into a gap formed between the light-transmissive member and the light shielding frame, so as to form the light-guiding supporting member in which the light-shielding frame and the light-transmissive member are supported by the light-reflective member; and bonding the second surface of the light-transmissive member to an upper surface of the light-emitting element so as to fix the light-guiding supporting member on or above the light-emitting element.

For example, the light-emitting device of the embodiment shown in FIG. 1 and FIGS. 2A and 2B can be obtained by the manufacturing method of the embodiment. The manufacturing method of the present embodiment is described with references to the accompanying drawings.

Mounting Step

Figure 6A:
FIG. 6A is schematic sectional view showing a mounting step.
Figure 6B:
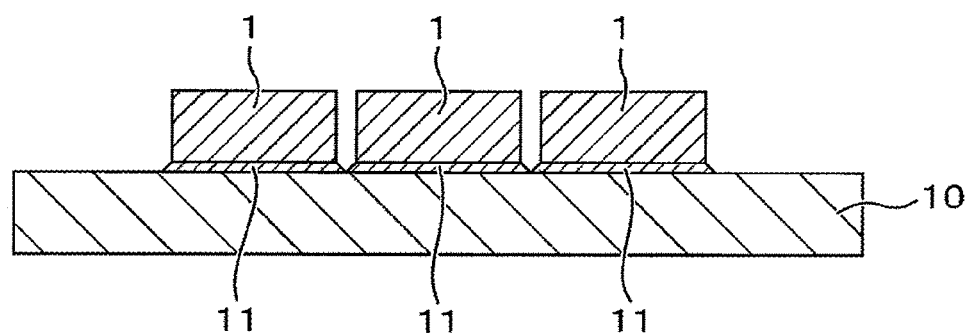
FIG. 6B is a schematic sectional view showing a mounting step.

In this step, the light-emitting element is mounted on the mounting board. That is, at least one light-emitting element 1 is mounted on a main surface of the mounting board 10 as shown in FIGS. 6A and 6B. For example, the light-emitting element 1 can be flip-chip mounted on the mounting board 10. Specifically, for example, the light-emitting element 1 including positive and negative electrodes on the same surface, which is the lower surface, is bonded with the electrically-conductive bonding members 11 such that the positive electrode faces a positive portion of the wiring disposed on the mounting board 10 and such that the negative electrode faces a negative portion of the wiring disposed on the mounting board 10. Similarly to FIG. 2A and other drawings, the electrically-conductive bonding members 11 in FIG. 6B are simplified without differentiating electrically-conductive bonding members 11 connected to the positive and negative electrodes of the light-emitting element 1 and electrically-conductive bonding members 11 connected to the positive and negative portions of the wiring disposed on the mounting board 10.

Light-Shielding Frame Placement Step

Figure 7A:
FIG. 7A is a schematic sectional view showing a light-shielding frame placement step.

In this step, the light-shielding frame provided with the opening is placed on the sheet. That is, the light-shielding frame 5 in which the opening 5a is defined by the frame part 5b is placed on a main surface of a sheet 4 as shown in FIG. 7A.

A plurality of light-shielding frames preliminarily formed into a desired shape can be provided, and individually disposed on the sheet. Alternatively, a light-shielding frame in which a plurality of light-shielding frames corresponding to unit regions are connected to each other in the row direction and/or the column direction can be provided and collectively disposed on the sheet. A heat resistant sheet having an adhesive surface can be used as the sheet. The base material of the sheet is made of, for example, a polyimide.

Light-Reflective Resin Application Step

Figure 7B:
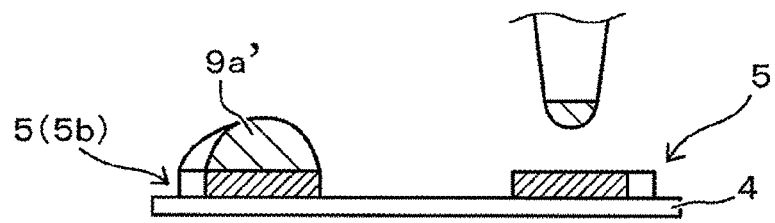
FIG. 7B is a schematic sectional view showing a light-reflective resin application step.
Figure 7C:
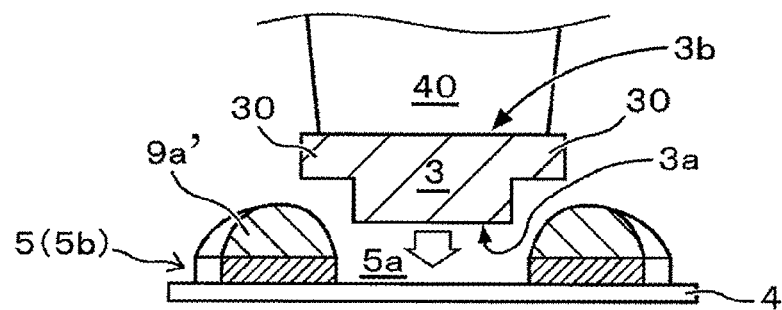
FIG. 7C is a schematic sectional view showing a light-guiding supporting member formation step.

In this step, the light-reflective resin is applied over the light-shielding frame. That is, the light-reflective resin 9a' is applied over the frame part 5b of the light-shielding frame as shown in FIG. 7B. In particular, the light-reflective resin 9a' is applied over the frame part 5b of the light-shielding frame 5 to extend at least over the narrow portions.

The light-reflective resin 9a' can be applied with an amount that can fill the region between the light-transmissive member 3 and the light-shielding frame 5 with the first light-reflective member 9a without any gap in the subsequent light-guiding supporting member formation step. The applied amount and the viscosity of the light-reflective resin 9a' can be adjusted so that the light-reflective resin 9a' does not adhere to the first surface 3a of the light-transmissive member 3 so as not to hinder light exit from the first surface 3a of the light-transmissive member 3, which serves as the light exit surface of the light-emitting device.

The light-reflective resin 9a' can be applied over the light-shielding frame 5, for example, by discharging the resin from the tip of a nozzle of a resin discharging device. For example, the light-reflective resin 9a' can be applied over the light-shielding frame 5 in a linear shape using a nozzle. More specifically, the light-reflective resin 9a' can be applied over the light-shielding frame 5 in a linear shape by reciprocating the nozzle with the light-reflective resin 9a' being discharged from the nozzle, so that the light-reflective resin 9a' can be disposed over the light-shielding frame 5 to extend over the narrow portions.

As described below, the light-transmissive member 3 is brought into contact with the light-reflective resin 9a' applied over the light-shielding frame 5, so that the uncured light-reflective resin 9a' moves across the surfaces of the light-shielding frame 5 and the light-transmissive member 3. Then the light-reflective resin 9a' covers the inner lateral surfaces of the opening 5a of the light-shielding frame 5 and the lateral surfaces of the light-transmissive member 3, and is supplied in the gap between the light-transmissive member 3 and the light-shielding frame 5.

The viscosity of the uncured light-reflective resin 9a' can be, for example, 5 Pa·s or more and 15 Pa·s or less. The resin material thus securely flows into the gap between the light-transmissive member 3 and the light-shielding frame 5, and is inhibited from wet-spreading over the first surface 3a of the light-transmissive member 3.

Light-Guiding Supporting Member Formation Step

In this step, the light-guiding supporting member in which the light-shielding frame 5 and the light-transmissive member 3 are supported by the first light-reflective member 9a is produced. Specifically, the light-reflective resin 9a' disposed over the light-shielding frame 5 is allowed to flow into the gap between the light-transmissive member 3 and the light-shielding frame 5 using the light-transmissive member 3, and cured to form the first light-reflective member 9a, so that the light-guiding supporting member 60 in which the light-shielding frame 5 and the light-transmissive member 3 are supported by the first light-reflective member 9a is obtained.

In the light-guiding supporting member formation step, a plate-shaped light-transmissive member 3 having the flanges 30 on its lateral surfaces is used as shown in FIGS. 7C to 7F. The light-transmissive member 3 is disposed at such a position as to leave a gap between the light-transmissive member 3 and the light-shielding frame 5 such that the first surface 3a of the light-transmissive member 3 faces the sheet 4 to bring the flanges 30 into contact with the light-reflective resin 9a'. The light-transmissive member 3 is then pressed to allow the light-reflective resin 9a' to flow into the gap to form the first light-reflective member 9a. The light-guiding supporting member 60 in which the light-shielding frame 5 and the light-transmissive member 3 are supported by the first light-reflective member 9a can thus be obtained.

The light-transmissive member 3 used in the light-guiding supporting member formation step has the first surface 3a and the second surface 3b opposite to the first surface 3a, a first latera surface 3c continuous with the first surface 3a, a second lateral surface 3d located outward of the first lateral surface 3c and continuous with the second surface 3b, and a third surface 3e continuous with the first lateral surface 3c and the second lateral surface 3d. The first surface 3a of the light-transmissive member 3 has a smaller outer perimeter than the inner perimeter of the opening 5a of the light-shielding frame 5. The second surface 3b has a larger area than an area of the first surface 3a. The light-transmissive member 3 has flanges 30 formed attributable to the difference between the area of the first surface 3a and the area of the second surface 3b. In this example, the first surface has a rectangular shape having long sides and short sides. The flanges 30 are formed at the lateral surfaces of the long sides of the rectangular shape.

Figure 7D:
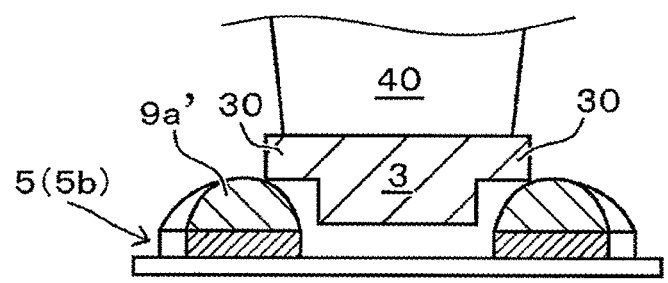
FIG. 7D is a schematic sectional view showing a light-guiding supporting member formation step.
Figure 7E:
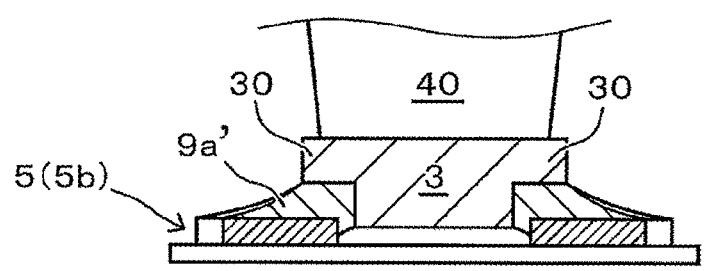
FIG. 7E is a schematic sectional view showing a light-guiding supporting member formation step.
Figure 7F:
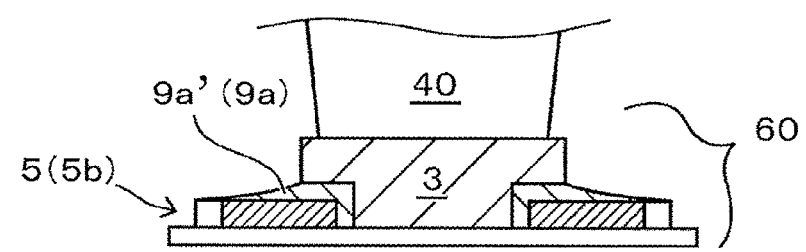
FIG. 7F is a schematic sectional view showing a light-guiding supporting member formation step.

When the light-transmissive member 3 is placed on the sheet 4, the flanges 30 of the light-transmissive member 3 are brought into contact with the light-reflective resin 9a' before the first surface 3a of the light-transmissive member 3 is brought into contact with the sheet 4 as shown in FIGS. 7C to 7F. Specifically, the light-transmissive member 3 is brought into contact with the light-reflective resin 9a' disposed on the light-shielding frame 5 such that the first surface 3a of the light-transmissive member 3 faces the sheet 4 at such a position as to leave a gap formed between the light-transmissive member 3 and the light-shielding frame 5. The light-reflective resin 9a' thus flows and is supplied in the gap between the frame part 5b of the light-shielding frame and the light-transmissive member 3 as shown in FIG. 7F.

More specifically, the contour of the flanges 30 of the light-transmissive member 3 is at least partially located outward of the inner perimeter of the opening 5a of the light-shielding frame 5 (see FIG. 7C), and the flanges 30 of the light-transmissive member 3 are brought into contact with the light-reflective resin 9a' applied over the light-shielding frame 5 (see FIG. 7D). Consequently, the light-reflective resin 9a' starts flowing from the contact points toward the lateral surfaces of the light-transmissive member 3 through the flanges 30 (see FIG. 7E), and the light-reflective resin 9a' is thus supplied into the gap between the lateral surfaces of the light-transmissive member 3 and the light-shielding frame 5 (see FIG. 7F). In the case in which the opening 5a of the light-shielding frame 5 and the second surface 3b of the light-transmissive member 3 both have rectangular shapes having long sides and short sides, the light-transmissive member 3 and the light-shielding frame 5 can be disposed such that the distance between a long side of the second surface 3b and a long side of the opening 5a is equal to the distance between a short side of the second surface 3b and a short side of the opening 5a in a top view.

In the light-guiding supporting member formation step, sucking with, for example, a collet can be used to place the light-transmissive member 3 on the sheet 4. For example, the light-transmissive member 3 picked up by sucking with a collet 40 can be placed on the sheet 4, and the light-reflective resin 9a' in contact with the flanges 30 of the light-transmissive member 3 can flow by subsequently pressing the light-transmissive member 3 by such sucking (see FIGS. 7C to 7F). When the flanges 30 of the light-transmissive member 3 are brought into contact with the light-reflective resin 9a' disposed over the light-shielding frame 5 (see FIG. 7D), the flanges 30 of the light-transmissive member 3 are first brought into contact with a portion of the light-reflective resin 9a' having the greatest height, and then with other portions of the light-reflective resin 9a' with a time lag (the details will be described below).

Light-Guiding Supporting Member Bonding Step

Figure 8A:
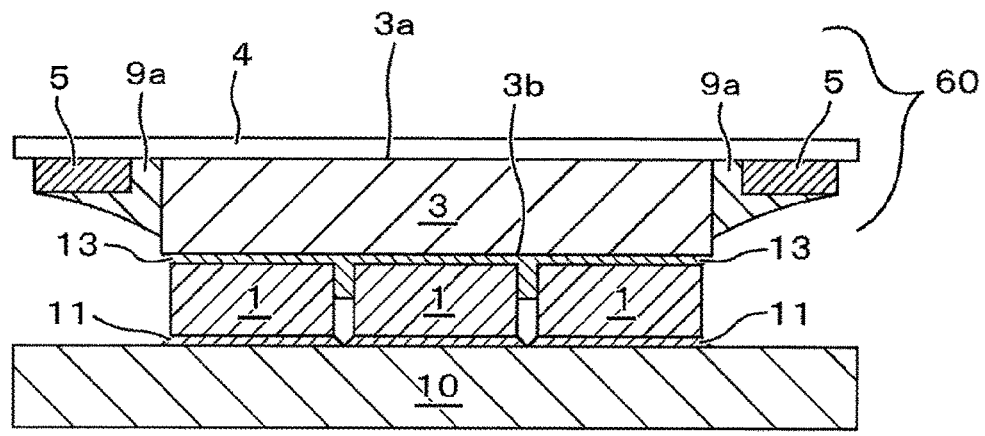
FIG. 8A is a schematic sectional view showing a light-guiding supporting member bonding step.

In this step, the light-guiding supporting member 60 is fixed over the light-emitting elements 1 by bonding the second surface 3b of the light-transmissive member 3 to the light-emitting surfaces (i.e., the upper surfaces) of the mounted light-emitting elements 1 as shown in FIG. 8A.

The light-transmissive member 3 of the light-guiding supporting member 60 obtained as described above is aligned with the light-emitting elements 1, and the light-transmissive member 3 is bonded to the light-emitting surfaces of the light-emitting elements 1 with, for example, the light guide member 13.

To obtain the light-emitting device of the embodiment shown in FIG. 1 and FIGS. 2A and 2B, the position of the light-guiding supporting member 60 is adjusted such that, for example, (i) the outer perimeter of the second surface 3b of the light-transmissive member 3 is located outward of the outer perimeter of the light-emitting elements 1 in a top view, and (ii) at least one side of the outer perimeter of the first surface 3a of the light-transmissive member 3 is located inward of the outer perimeter of the light-emitting elements 1 in a top view.

When the second surface 3b of the light-transmissive member 3 of the light-guiding supporting member 60 is bonded to the upper surfaces of the light-emitting elements 1, the light guide member 13 can be preliminarily applied over the second surface 3b before the light-transmissive member 3 is placed over the light-emitting elements 1, or the light guide member 13 can be applied over the upper surfaces of the light-emitting elements 1 before the light-transmissive member 3 of the light-guiding supporting member 60 is placed over the light-emitting elements 1. The amount of the light guide member 13 to be applied, the load when the light-transmissive member 3 is placed on the light-emitting elements 1 and pressed, and the viscosity of a resin material used for the light guide member 13 when being applied can be appropriately selected in consideration of a desired shape of the light guide member 13 after the light-transmissive member 3 of the light-guiding supporting member is bonded to the light-emitting elements 1.

Sheet Removal Step

The sheet 4 can be removed after the light-guiding supporting member bonding step or in a sheet removal step after the second light-reflective member formation step.

Second Light-Reflective Member Formation Step

Figure 8B:
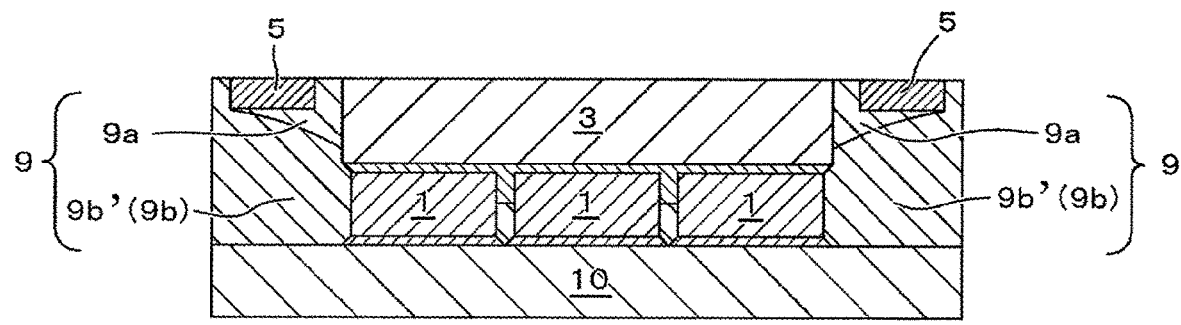
FIG. 8B is a schematic sectional view showing a second light-reflective member formation step.

In this step, an additional light-reflective member is formed, that is, the second light-reflective member 9b is formed. Specifically, an uncured second light-reflective resin 9b' constituting the second light-reflective member 9b is supplied into the gap between the mounting board 10 and the light-shielding frame 5 to form the light-reflective member 9b surrounding the light-emitting elements 1 and the light-transmissive member 3 between the mounting board 10 and the light-shielding frame 5 (see FIG. 8B). The second light-reflective member 9b can constitute the integrated light-reflective member 9 in combination with the first light-reflective member 9a described above. FIG. 8B shows an example in which the sheet 4 has been removed before the second light-reflective member formation step.

For example, a light-shielding frame 5 that has a size smaller than the mounting board 10 (i.e., having such a size that the outer periphery of the light-shielding frame 5 is encompassed by the mounting board 10 in a top view) can be used, and the second light-reflective resin 9b' is supplied into the gap between the mounting board 10 and the light-shielding frame 5 from the outer perimeter of the light-shielding frame.

After the second light-reflective resin 9b' is supplied into the gap between the mounting board 10 and the light-shielding frame 5, the supplied second light-reflective resin 9b' is cured. The second light-reflective member 9b is thus formed.

The light-emitting device of the present embodiment is manufactured as described above.

The above description has been made referring to the drawings each showing a single light-emitting device.

However, in the method of manufacturing a light-emitting device of the present embodiment, a plurality of light-emitting devices can each be produced as a unit by providing a mounting board and a light-shielding frame both of which include a plurality of unit regions respectively corresponding to the individual light-emitting devices, and the product can be then divided into the individual light-emitting devices.

For example, a mounting board to be used can include a plurality of (n×m) unit regions configured by a plurality of rows (n rows) and a plurality of columns (m columns). The unit regions can be defined by the mounting board and the light-shielding frame.

Also, for example, a light-shielding frame including a plurality of (n×m) unit regions configured by a plurality of rows (n rows) and a plurality of columns (m columns) corresponding to the mounting board can be used as the light-shielding frame. Alternatively, for example, a plurality of (n×m) light-shielding frames configured by a plurality of rows (n rows) and a plurality of columns (m columns) corresponding to the mounting board can be used, and each of the light-shielding frames can be regarded as the unit region.

More specifically, a plurality of light-emitting devices can be produced as described below.
(1) One or more light-emitting elements are mounted in each unit region in the light-emitting element mounting step.
(2) The light-guiding supporting member is formed in each unit region in the light-guiding supporting member formation step.
(3) In the light-guiding supporting member bonding step, the light-guiding supporting member is bonded to collectively cover the one or more light-emitting elements mounted in each unit region.
(4) In the second light-reflective member formation step, the second light-reflective resin is formed into the gap between the mounting board and the light-shielding frame of each unit region.

After the second light-reflective member formation step, the light-reflective member and the mounting board are divided into individual unit regions in the division step to singulate the light-emitting devices. The division can be performed by, for example, cutting with a blade.

The positions to be divided into unit regions are preferably away from the outer perimeter of the light-shielding frame in consideration of the division into unit regions. In other words, the light-shielding frame has preferably a size smaller than the outer shape of the light-emitting device. In this case, for example, a plurality of light-shielding frames that each have a size slightly smaller than the outer shape of the corresponding light-emitting device can be used for the light-shielding frame.

In the above method of manufacturing a light-emitting device, a plurality of light-emitting devices are produced as units and then divided into individual light-emitting devices. Accordingly, the light-emitting device is easily manufactured.

The effect of the narrow portions of the light-shielding frame will be described in detail. In the embodiment of the present disclosure, a light-shielding frame having a "narrow portion," which is small in width in a top view, is used. In particular, in the light-reflective resin application step in which the light-reflective resin is applied over the light-shielding frame, the light-reflective resin is disposed at least over the narrow portion.

FIG. 3 and FIG. 4 show an example of the light-shielding frame 5. The light-shielding frame 5 has the frame part 5b defining the opening 5a. The frame part 5b extends in a quadrangular manner in a top view to surround the opening 5a. In short, the light-shielding frame 5 has a shape formed by removing a portion corresponding to the opening 5a from a flat plate. For example, the light-shielding frame 5 shown in the drawings has a shape formed by removing a quadrangular portion corresponding to the opening 5a from a quadrangular flat plate.

As shown in FIG. 3 and FIG. 4, the lateral width of the frame part 5b of the light-shielding frame 5 used in the embodiment of the present disclosure is not uniform but is locally reduced. That is, the width of the frame part 5b of the light-shielding frame 5 is partially small in a top view due to the narrow portions 50.

The light-shielding frame 5 having the narrow portions 50 contributes to inhibition of generation of voids in the manufacture of the light-emitting device. More specifically, the existence of the narrow portions 50 of the light-shielding frame 5 can inhibit or prevent generation of voids in the region of the first light-reflective member between the light-transmissive member and the light-shielding frame when the light-guiding supporting member is formed.

Voids generated when the light-guiding supporting member is formed are bubbles or the like formed when the light-reflective resin flows into the gap between the light-transmissive member and the light-shielding frame. When the light-guiding supporting member is formed, the light-reflective resin is disposed over the light-shielding frame, and then the light-transmissive member is disposed on the sheet. When the light-transmissive member is disposed, the light-reflective resin disposed over the light-shielding frame is pressed by the flanges of the light-transmissive member, and this pressure allows the light-reflective resin to flow into the gap between the light-transmissive member and the light-shielding frame. The resin flow into the gap may lead to generation of voids. This void generation is attributable to large areas of the light-reflective resin being simultaneously in contact with the flanges of the light-transmissive member when the light-transmissive member is disposed. In particular, generation of voids is considered to be promoted by a rush of the light-reflective resin into the gap between the light-transmissive member and the light-shielding frame caused by such contact between large areas. If the light-reflective resin containing voids is cured to form the first light-reflective member, the voids are remained in the light-guiding supporting member. It is considered that voids (bubbles) are likely to remain, particularly in the region of the first light-reflective member between the light-transmissive member and the light-shielding frame in a top view.

Such residual voids in the light-guiding supporting member are not desirable for the optical properties of the light-emitting device. For example, the voids may reduce the effects such as inhibition of reduction in light extraction efficiency provided by the first light-reflective member disposed between the light-transmissive member and the light-shielding frame. The light-shielding frame, which increases the difference in luminance between the inside and the outside of the light exit surface, has the property of absorbing light. The light extraction efficiency of the light-emitting device may therefore be reduced by direct contact between the light-transmissive member and the light-shielding frame. Hence, in the light-emitting device of the present embodiment, the reduction in light extraction efficiency is inhibited by the first light-reflective member disposed between the light-transmissive member and the light-shielding frame. Accordingly, if there are voids (bubbles) in the region of the first light-reflective member, effects such as inhibition of reduction in light extraction efficiency of the light-emitting device are reduced. The manufacturing method according to the embodiment of the present disclosure may reduce or prevent such residual voids in the light-guiding supporting member, so that a light-emitting device having desired optical properties is manufactured.

Also, the residual voids in the light-guiding supporting member may reduce the bonding strength between components. In the light-guiding supporting member, the first light-reflective member is disposed between the light-transmissive member and the light-shielding frame to bond the light-transmissive member to the light-shielding frame. If there are voids (bubbles) in the region of the first light-reflective member, the bonding strength may be inhibited. More specifically, the voids in the region of the first light-reflective member may reduce bonding strength between the first light-reflective member and the light-transmissive member and/or bonding strength between the first light-reflective member and the light-shielding frame. In the manufacturing method according to the embodiment of the present disclosure, such residual voids can be reduced or prevented, so that bonding strength between components of the light-guiding supporting member is more suitably retained.

Reduction in the residual voids is described in detail. In the manufacturing method according to the embodiment of the present disclosure, the height of the light-reflective resin applied over the light-shielding frame is locally different because of the narrow portions of the light-shielding frame. That is, the light-reflective resin disposed over the light-shielding frame includes a relatively high portion and a relatively low portion in height from the light-shielding frame in the light-guiding supporting member formation step. The heights of the light-reflective resin in the frame parts other than the narrow portions is preferably relatively low to cause the heights of the portions of the light-reflective resin located over the narrow portions to be relatively great (the details will be described below). Accordingly, the light-reflective resin is brought into contact with the light-transmissive member with a time lag because of the height difference of the light-reflective resin in the light-guiding supporting member formation step, so that generation of the residual voids in the resulting light-guiding supporting member are reduced.

Figure 5A:
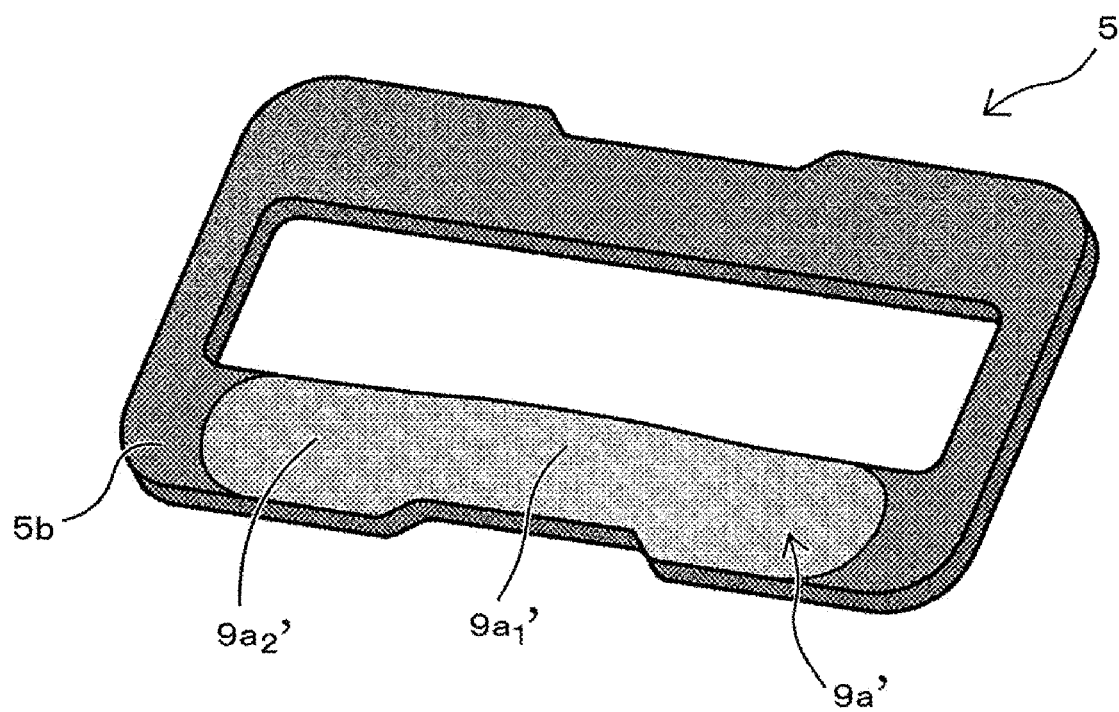
FIG. 5A is a schematic perspective view of a light-reflective resin applied over the light-shielding frame having narrow portions.
Figure 5B:
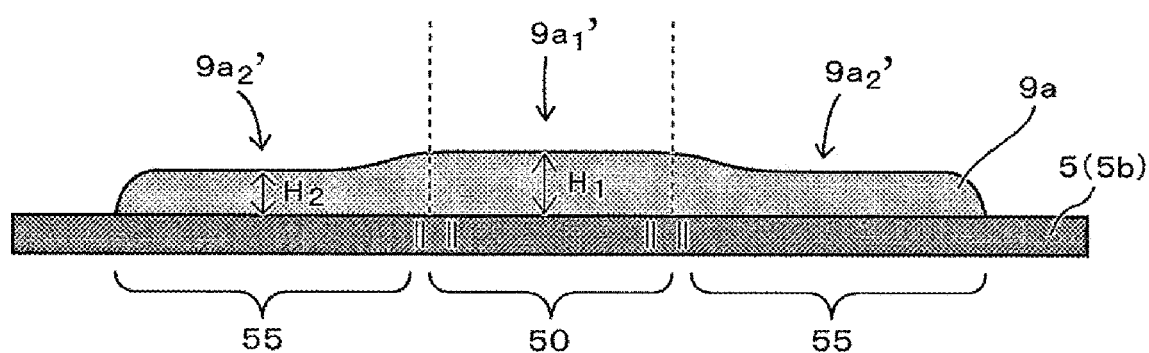
FIG. 5B is a schematic perspective view of a light-reflective resin applied over the light-shielding frame having narrow portions.

FIGS. 5A and 5B schematically show the form of the light-reflective resin $9a'$ applied over the light-shielding frame 5 in the light-reflective resin application step. As shown in the drawings, a top portion $9a_1'$ of the light-reflective resin $9a'$ is located on the narrow portion 50 in the light-reflective resin application step. That is, it is preferable that the relation $H_1 > H_2$ holds, where $H_1$ represents the height of the light-reflective resin $9a_1'$ directly above a narrow portion 50 in the light-reflective resin $9a'$ applied over the light-shielding frame 5, and where $H_2$ represents the height of a light-reflective resin $9a_2'$ disposed over a non-narrow portion 55 other than the narrow portion. The reason why the top portion of the light-reflective resin is located on the narrow portion is deemed to be as follows. When the fluid light-reflective resin is applied over the light-shielding frame having the narrow portion, the light-reflective resin wet-spreads over the light-shielding frame. The frame part, other than the narrow portion of the light-shielding frame, is relatively broad, and thus the light-reflective resin wet-spreads over a larger area. On the other hand, the narrow portion of the frame part is relatively small, and thus the light-reflective resin spreads over a smaller area. The height of the applied light-reflective resin decreases as the light-reflective resin spreads over the light-shielding frame, so that the height of the light-reflective resin becomes lower in relatively broad portion of the frame part (the portion other than the narrow portion). Accordingly, the height of the portion of the light-reflective resin located on the narrow portion becomes relatively great.

If the height of the light-reflective resin located on the narrow portion is relatively great, voids are unlikely to be generated in the light-guiding supporting member formation step. In the light-guiding supporting member formation step, the light-reflective resin disposed over the light-shielding frame is allowed to flow into the gap between the light-transmissive member and the light-shielding frame by pressure of the light-transmissive member. When the light-transmissive member is pressed, the light-reflective resin disposed over the light-shielding frame is brought into contact with the light-transmissive member. Supposing that the height of the light-reflective resin applied over the light-shielding frame is uniform, large areas of the flanges of the light-transmissive member and the light-reflective resin are likely to be simultaneously brought into contact with each other by pressing the light-transmissive member against the light-reflective resin. Simultaneous contact between large areas is likely to keep a larger amount of air caught or inserted between the light-transmissive member and the light-reflective resin, so that it becomes difficult for the air to escape when the light-reflective resin flows into the gap between the light-transmissive member and the light-shielding frame. That is, voids are likely to remain when the light-guiding supporting member is formed. On the other hand, the height of the light-reflective resin applied over the light-shielding frame is locally different (see FIG. 5B) in the manufacturing method according to the embodiment of the present disclosure, so that the flanges of the light-transmissive member is in contact with the light-reflective resin to a time lag. Specifically, the top of the light-reflective resin located on the narrow portion is the highest, relatively, in the light-reflective resin applied on the light-shielding frame, and thus the portion of the light-reflective resin on the narrow portion starts being in contact with the flanges of the light-transmissive member. That is, the contact of the light-reflective resin to the light-transmissive member starts with the portion of the light-reflective resin on the narrow portion. In such a case in which the contact starts at the portion of the light-reflective resin on the narrow portion and the contact proceeds with a time lag, and the air in the gap is likely to escape to the outside when the light-reflective resin is supplied into the gap between the light-transmissive member and the light-shielding frame. That is, the light-guiding supporting member is obtained by curing the light-reflective resin supplied into the gap between the light-transmissive member and the light-shielding frame, and generation of voids is inhibited before the curing. As described above, in the embodiment of the present disclosure, the narrow portions of the light-shielding frame have the effect of improving filling properties of the light-reflective resin with which generation of voids is inhibited in the light-guiding supporting member formation step.

Contact between the light-transmissive member and the light-reflective resin with a time lag is described in detail referring to the schematic diagrams of FIGS. 10A to 10D. FIGS. 10A to 10D schematically show changes over time in the light-guiding supporting member formation step. The left drawings schematically show changes of top portions of the light-reflective resin over time, and the right drawings schematically show changes of non-top portions of the light-reflective resin over time. That is, the left drawings schematically show relations between the light-reflective resin 9a' disposed over the narrow portions 50 and the flanges 30 of the light-transmissive member 3 over time, and the right drawings schematically show relations between the light-reflective resin 9a' disposed over the non-narrow portions 55 and the flanges 30 of the light-transmissive member 3 over time. As shown in the drawings, when the light-transmissive member 3 is disposed on the sheet 4, the light-reflective resin 9a' disposed over the narrow portions 50 is brought into contact with the flanges 30 of the light-transmissive member 3 as shown in the left drawing in FIG. 10A. Subsequently, as the light-transmissive member 3 moves down, the light-reflective resin 9a' disposed over the non-narrow portions 55 is brought into contact with the flanges 30 of the light-transmissive member 3 as shown in the right drawing in FIG. 10C. As described above, when the light-transmissive member 3 is brought into contact with the light-reflective resin 9a' disposed over the light-shielding frame 5, the flanges 30 of the light-transmissive member 3 are first brought into contact with the highest portions of the light-reflective resin 9a' (i.e., the highest portions of the light-transmissive resin on the narrow portion 50) and then with other portions of the light-reflective resin 9a' with a time lag.

As shown in FIG. 10A to 10D, the light-shielding frame 5 is disposed so as to face the flanges 30 of the light-transmissive member 30. That is, the flames 30 overlap with the light-shielding flame 5 in a top view. In this example, the light-shielding frame has narrow portions 50 and non-narrow portions 55, whereby the light reflective resin 9a' disposed over the narrow portions 50 starts to be in contact with the first surface of the light-transmissive member 3. That is, the light-shielding frame having the narrow portions 50 and the non-narrow portions 55 that are positioned on sides overlapping with the second surface of the light-transmissive member in a top view can allow the surface of the light-transmissive resin over the narrow portions to serve as a starting point of the contact of the light-reflective resin to the light-transmissive member.

In application of the light-reflective resin performed before the light-guiding supporting member is formed, the light-reflective resin is applied over the narrow portions and also over the regions of the frame part other than the narrow portions. Particularly in the regions of the frame part other than the narrow portions, the resin application is performed preferably such that regions over which the light-reflective resin wet-spreads are left on the light-shielding frame 5. This is because the height of the light-reflective resin located over the narrow portions becomes relatively great if the light-reflective resin wet-spreads over the regions of the frame part other than the narrow portions. In this view, the light-reflective resin is applied preferably such that regions for wet-spreading are not substantially left in the narrow portions or, in the case in which the regions for wet-spreading are left, such that regions for wet-spreading are smaller than in the case of the regions of the frame part other than the narrow portions. For example, the light-reflective resin can be applied to fill substantially the entire width of the narrow portions.

In the light-shielding frame 5, the frame part 5b extends, for example, in a quadrangular manner to define the opening 5a in a top view (see FIG. 4). In other words, the frame part 5b has a quadrangular shape in a top view. In the embodiment of the present disclosure, the narrow portion 50 can be provided in a portion of the frame part 5b corresponding to at least one side of the quadrangular shape. It is preferable that only one narrow portion 50 be provided in a portion of the frame part 5b corresponding to a single side of the quadrangular shape. That is, the number of narrow portions 50 provided in a portion of the frame part 5b corresponding to the single side is preferably one but not more than one. This structure can facilitate escape of air to the outside when the light-reflective resin is supplied into the gap between the light-transmissive member and the light-shielding frame in the light-guiding supporting member formation step. The expression "quadrangular shape" as used herein refers to a substantially quadrangular shape and should be broadly interpreted so as to imply squares, rectangles, parallelograms, and trapezoids.

The narrow portion 50 is a portion of the frame part 5b of the light-shielding frame 5 having a relatively small width. The light-shielding frame has a recessed or notched shape in a top view because of the narrow portion 50 (hereinafter the recessed or notched portion is also referred to as a "recessed portion"). The contour of the recessed portion of the narrow portion 50 can be constituted by straight lines, a curved line, or a combination of these lines in a top view. For example, the recessed portion can have a substantially quadrangular shape in a top view. The expression "substantially quadrangular shape" as used herein should be broadly interpreted so as to imply not only a complete quadrangular shape but also shapes that can be regarded by a person skilled in the art as shapes obtained by modifying the complete quadrangular shape. Hence, for example, the expression "substantially quadrangular shape" implies squares, rectangles, parallelograms, and trapezoids, but portions constituting the angles (such as corners) of such a shape does not necessarily have to be sharp but can be round (in short, the corners of the contour can be rounded off).

For example, the narrow portion has a recessed or notched shape in a top view in the outer region of the light-shielding frame. That is, the outer contour of the narrow portion of the light-shielding frame can be recessed. In the light-shielding frame 5 shown in FIG. 3 and FIG. 4, an outer edge 5bi of the frame part 5b is partially recessed inward. The light-shielding frame having the recessed outer contour at the narrow portion can allow a desired light-guiding supporting member to be easily formed. Specifically, a desired amount of the first light-reflective member is likely to be disposed between the light-transmissive member and the light-shielding frame. Supposing that not the outer contour but the inner contour of the narrow portion of the light-shielding frame is recessed, the lateral width of the first light-reflective member between the light-transmissive member and the light-shielding frame varies because of the narrow portion. That is, when the light-emitting device is viewed from above, there is a relatively large amount of the first light-reflective member beside the narrow portion, and there is a relatively small amount of the first light-reflective member beside a non-narrow portion, so that the effect of inhibition of reduction in light extraction efficiency may be locally different. In other words, luminance between the light exit surface and the surrounding region may locally different. On the other hand, in the case in which the outer contour of the light-shielding frame is recessed to constitute the narrow portion as in the manufacturing method of the present embodiment, such disadvantages are likely to be avoided.

The narrow portion corresponds to the portion with a reduced lateral width of the light-shielding frame, but the width does not have to be more greatly reduced than necessary. For example, the lateral width of the narrow portion can be half or more of the lateral width of the light-shielding frame. More specifically, referring to the lateral width of the narrow portion 50 of the light-shielding frame 5 as "w," and to the lateral width of a portion of the light-shielding frame other than the narrow portion (see FIG. 4) as "W," then the relation between "w" and "W" is preferably 0.50W≤w≤0.95W, for example, 0.60W≤w≤0.95W, 0.70W≤w≤0.95W, or 0.80W≤w≤0.95W. If the lateral width w of the narrow portion is less than 0.5W, it becomes difficult to retain the applied light-reflective resin on the light-shielding frame according to the amount to be applied, and the disadvantage that the light-reflective resin overflows the frame part of the light-shielding frame is likely to occur. On the other hand, if the lateral width w of the narrow portion is larger than 0.95W, the top portion of the light-reflective resin is unlikely to be formed on the narrow portion. That is, the effect of the relatively high portion of the light-reflective resin located on the narrow portion is unlikely to be obtained. The expression "lateral width w" as used in the present specification refers to the dimension at a point of each narrow portion where the value is at its maximum in the case in which the dimension varies according to the point to be employed. Similarly, the expression "lateral width W" as used in the present specification refers to the dimension at a point where the value is at its maximum in the portion of the frame part corresponding to "a side" in the case in which the dimension varies according to the point to be employed.

In one configuration, a central region of the light-shielding frame has a narrow portion. Specifically, the narrow portion 50 is provided at the center of the length in a longitudinal direction of the light-shielding frame 5 in a top view as shown in FIG. 3 and FIG. 4. The narrow portion 50 can be provided in a central portion of a side of the quadrangular shape of the light-shielding frame 5 (i.e., in a region that divides the side into two substantially equal parts) in a top view. If the narrow portion is provided in the central region of the light-shielding frame as described above, the light-reflective resin disposed over the central region constitutes the top portion. Hence, in the light-guiding supporting member formation step in which the light-reflective resin is brought into contact with the flange of the light-transmissive member with a time lag, the light-transmissive member is consecutively brought into contact with the light-reflective resin from the center to outward (particularly in two opposite outward directions). That is, it becomes easy for air in the gap to escape outward from the center when the light-reflective resin flows into the gap between the light-transmissive member and the light-shielding frame. In particular, the air is likely to escape more evenly from the central portion toward the opposite directions, so that a light-guiding supporting member in which residual voids have been reduced may be obtained.

Narrow portions can be provided at opposite positions of the frame part of the light-shielding frame. For example, the narrow portion 50 can be provided on each of the opposite sides of the quadrangular shape of the frame part 5b of the light-shielding frame in a top view (see FIG. 4). That is, in the case in which the light-shielding frame has, for example, a quadrangular shape in a top view, a pair of narrow portions can be provided on portions of the frame part corresponding to the opposite sides of the quadrangular shape. The light-shielding frame having the narrow portions opposite to each other may reduce residual voids in a broader area.

In the case in which the light-shielding frame has a rectangular shape in a top view (i.e., in which the frame part 5b has a rectangular shape in a top view) as shown in FIG. 3 and FIG. 4, a pair of narrow portions can be provided on the long sides. For example, a pair of narrow portions 50 can be provided only on the long sides of the rectangular shape, and no narrow portions 50 can be provided on the short sides (see FIG. 3 and FIG. 4). Voids are likely to be left particularly in the portions corresponding to the long sides of the rectangular light-shielding frame. This is because the light-transmissive member is brought into contact with the light-reflective resin with larger surface areas in the portions of the light-shielding frame corresponding to the long sides when the light-transmissive member is disposed, so that it is difficult for air in the gap to escape to the outside when the light-reflective resin flows into the gap between the light-transmissive member and the light-shielding frame. Accordingly, the light-shielding frame used in the light-emitting device of the present embodiment can have the narrow portions on the "long sides" in which the air is unlikely to escape so as to more effectively inhibit generation of voids. In other words, effects such as inhibition of generation of voids are more likely to be evident in the case in which the narrow portions are provided on the portions of the light-shielding frame corresponding to the long sides.

Figure 9:
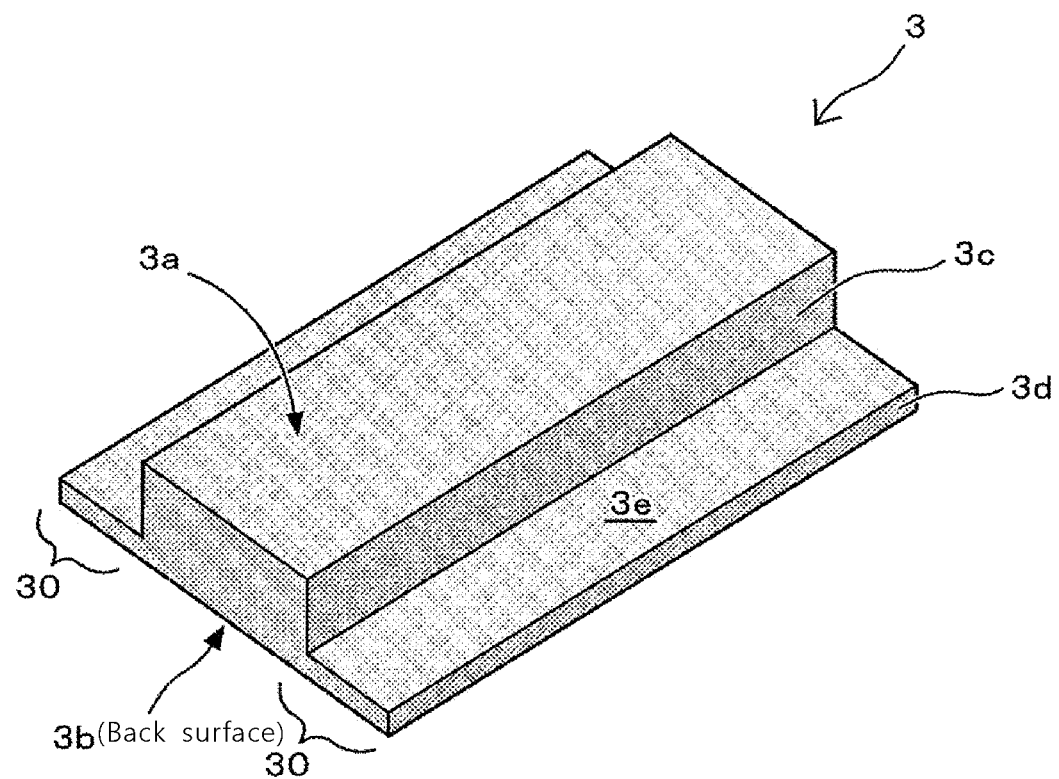
FIG. 9 is a perspective view showing an example of a light-transmissive member.
Figure 10A:
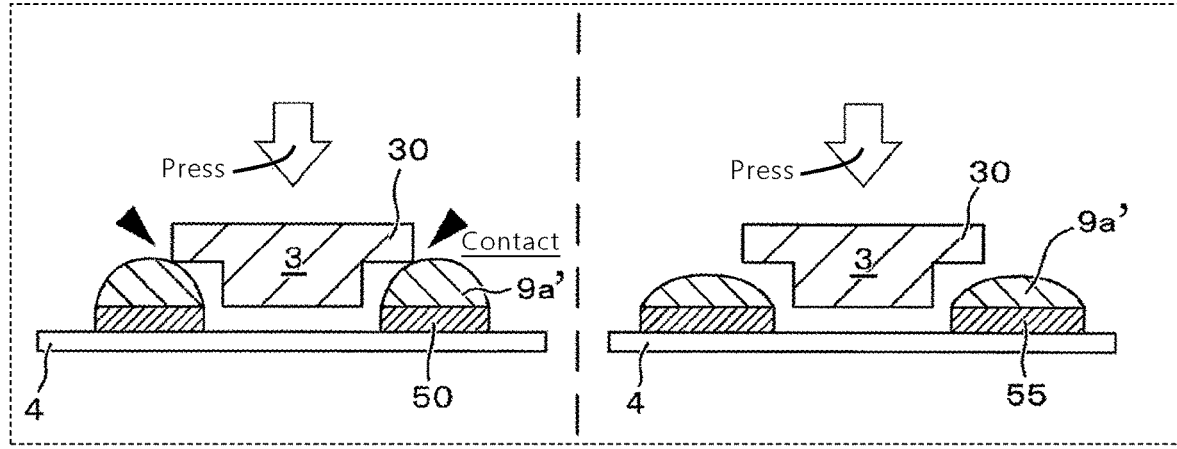
FIG. 10A is a sectional view showing examples of the manufacturing method according to the embodiment.
Figure 10B:
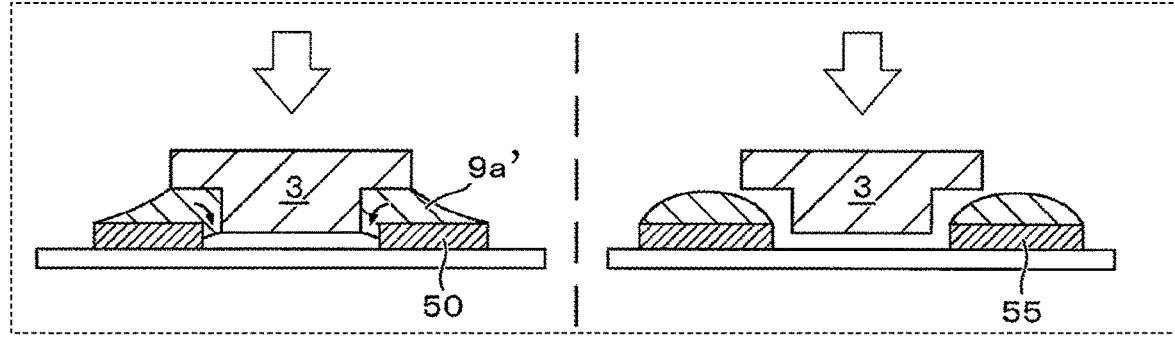
FIG. 10B is a sectional view showing an example of the manufacturing method according to the embodiment.
Figure 10C:
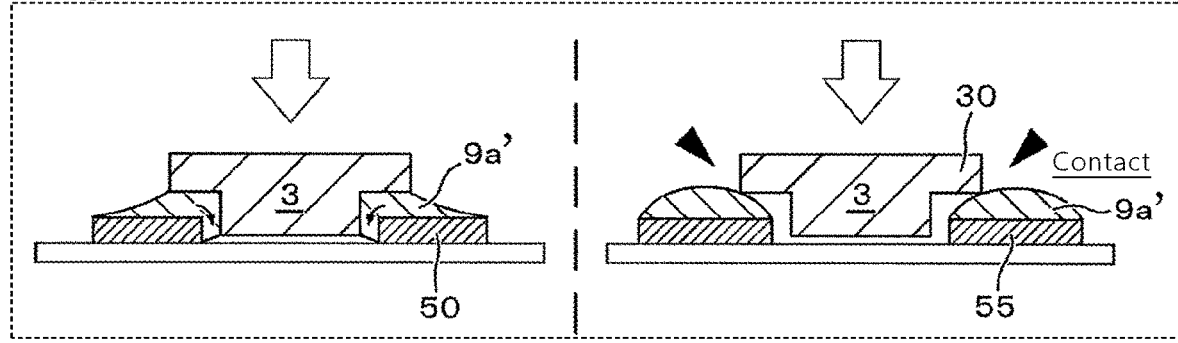
FIG. 10C is a sectional view showing an example of the manufacturing method according to the embodiment.
Figure 10D:
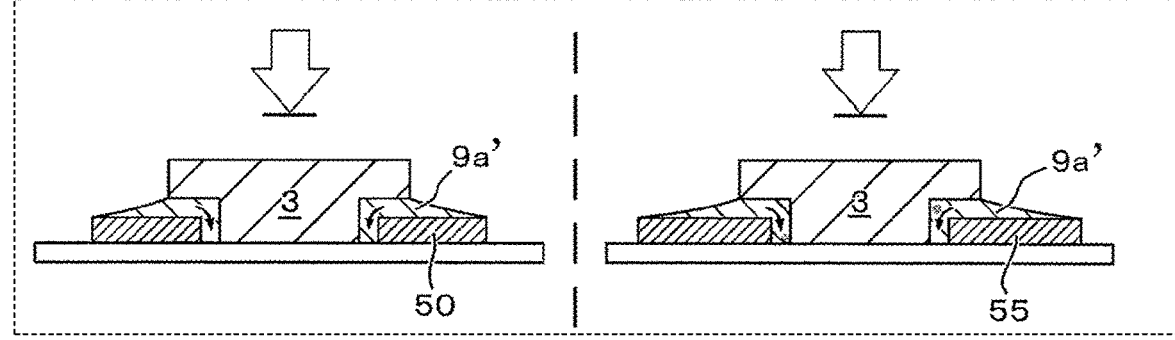
FIG. 10D is a sectional view showing an example of the manufacturing method according to the embodiment.
Figure 11:
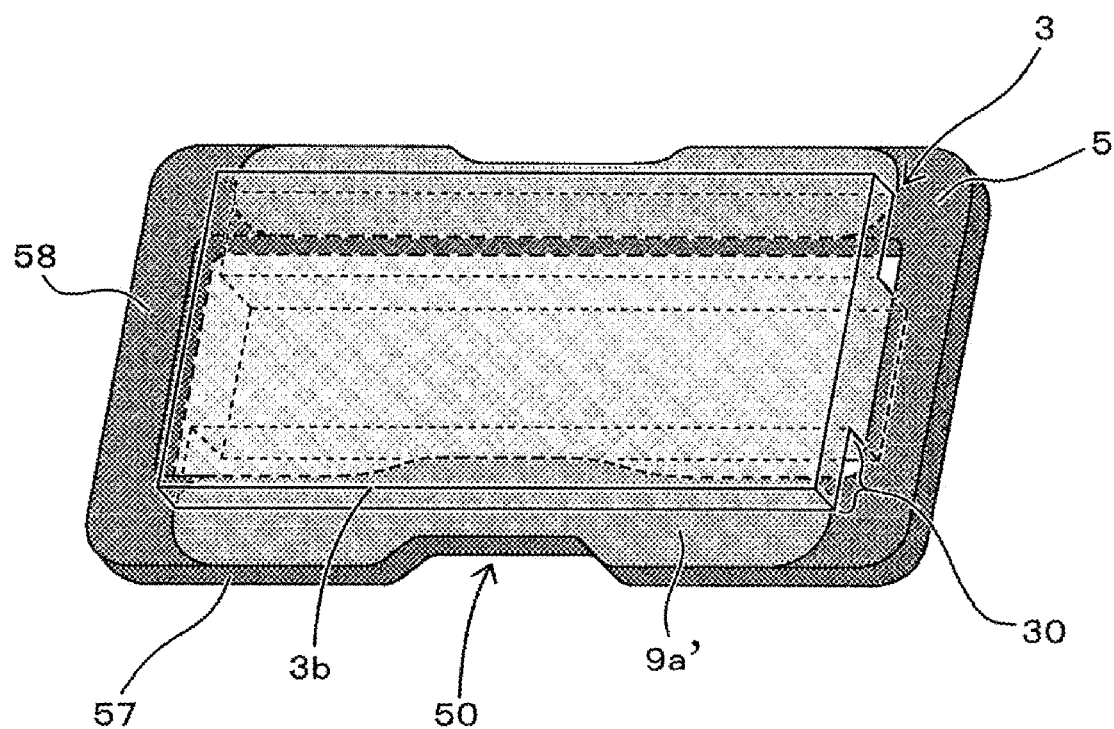

In the case in which the light-shielding frame 5 has a rectangular shape in a top view (i.e., the light-shielding frame 5 has long sides and short sides in a top view), the first surface 3a of the light-transmissive member 3 also has a rectangular shape in a top view. Particularly, the light-transmissive member 3 preferably includes flanges 30 on the log sides of the first surface 3a, as shown in FIG. 9. On the other hand, no flanges 30 can be provided on the short sides of the first surface 3a. In such a case, the long sides 57 of the frame part (also referred to as long-side frame portions 57) of the light-shielding frame 5 overlap with the light-transmissive member 3, although the short sides 58 of the frame part (also referred to as short-side frame portions 58) of the light-shielding frame 5, as seen from the first surface 3a (i.e., top surface) of the light-transmissive member 3. In such a case, voids generated in the region between the long-side frame portions 57 and the flange 30 are likely to escape to the outside through the short-side frame portions 58 in the light-guiding supporting member formation step.

The lateral width w of each narrow portion can be half or more of the lateral width W of the light-shielding frame as described above. On the other hand, for example, a dimension l (hereinafter also referred to as the "longitudinal length") of the narrow portion in the longitudinal direction of the frame part 5b (see FIG. 4) can be larger than the lateral width w as shown in the drawings. That is, the longitudinal length l of the narrow portion orthogonal to the lateral width w in a top view can be larger than the lateral width w. If the longitudinal length l of the narrow portion is larger than the lateral width w, local differences in height of the light-reflective resin applied over the light-shielding frame are more likely to be evident. That is, in the case in which the longitudinal length l of the narrow portion is greater than the lateral width w, effects such as "inhibition of generation of voids attributable to the top portion of the light-reflective resin located over the narrow portion when the light-guiding supporting member is formed" are more likely to be increased. For example, the longitudinal length l of the narrow portion can be not less than twice, not less than 3 times, not less than 5 times, or not less than 10 times as large as the lateral width w. For example, the longitudinal length l of the narrow portion can be not more than 50 times or not more than 40 times as large as the lateral width w. The expression "longitudinal length l" as used the present specification refers to the dimension at a point where the value is at its maximum in each narrow portion in the case in which the dimension varies according to the point to be employed.

The longitudinal length l of the narrow portion 50 is less than an overall length L of the straight portion of the frame part 5b as shown in FIG. 4. That is, the narrow portion 50 has a longitudinal length l shorter than a longitudinal length L of a portion of the frame part 5b corresponding to a side of the quadrangular shape of the light-shielding frame 5 in a top view. For example, the longitudinal length l of the narrow portion can be not more than ½, not more than ⅓, not more than ⅕, or not more than ⅒ of the longitudinal length L of the frame part 5b, which are merely examples. The lower limit is not limited to particular values, and the longitudinal length l of the narrow portion can be, for example, not less than ⅟₃₀ or not less than ⅟₂₀ of the longitudinal length L of the frame part 5b. This structure can more suitably provide the non-narrow portion of the frame part 5b corresponding to a side of the quadrangular shape over which the light-reflective resin wet-spreads, and local differences in height of the light-reflective resin applied over the light-shielding frame are more likely to be made. The expression "longitudinal length L" as used in the present specification refers to the dimension at a point where the value is at its maximum in the portion of the frame part corresponding to "a side" in the case in which the dimension varies according to the point to be employed.

In one example, application of the light-reflective resin in the light-reflective resin application step includes at least a first application and a second application, and the first application and the second application overlap with each other on the narrow portion. The top portion of the light-reflective resin is thus more certainly located on the narrow portion. For example, the starting point or the end point of the first application can overlap with the starting point or the end point of the second application on the narrow portion. Such overlap of the applications of the light-reflective resin on the narrow portion is likely to make the height of the portion of the light-reflective resin located on the narrow portion relatively great.

Figure 12A:
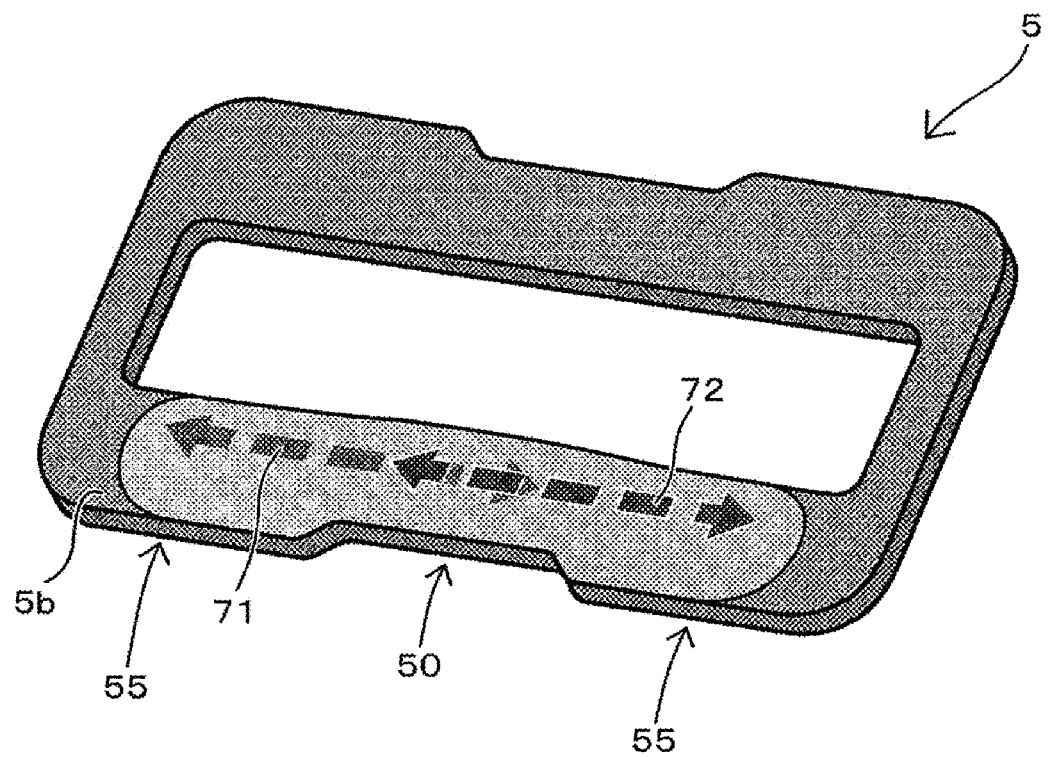
FIG. 12A is a schematic perspective view for illustrating overlap applications on the narrow portion.
Figure 12B:
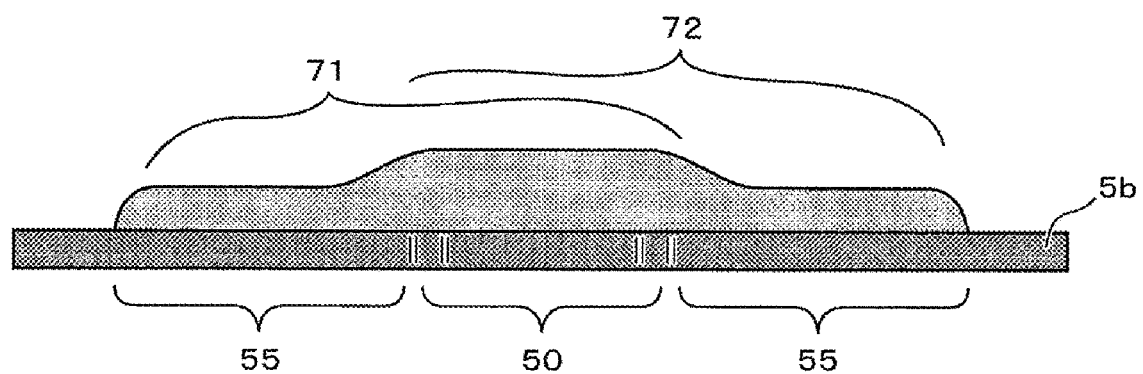
FIG. 12B is a schematic perspective view for illustrating overlap applications on the narrow portion.

An example will be described referring to FIGS. 12A and 12B. In the case in which the light-reflective resin is applied over the light-shielding frame 5 along the frame part 5b in a first application 71, and in which the light-reflective resin is applied over the light-shielding frame 5 along the frame part 5b also in a second application 72, the light-reflective resin applied in the first application 71 and the second application 72 overlap with each other on the narrow portion 50. The light-reflective resin is preferably applied such that the first application 71 and the second application 72 overlap with each other only on the narrow portion 50 of the light-shielding frame 5, and such that the first application 71 and the second application 72 do not overlap with each other on the non-narrow portion 55 of the light-shielding frame 5. In such a case, the height of the light-reflective resin on the narrow portion is likely to be great because of the overlap of the applied light-reflective resin. Accordingly, the combination of this constitution and the wet-spreading effect of the light-reflective resin over the narrow portion described above can make the top portion of the light-reflective resin more likely to be formed on the narrow portion. Hence, the light-reflective resin is more likely to be in contact with the flange of the light-transmissive member with a time lag in the light-guiding supporting member formation step, so that escape of air in the gap to the outside when the light-reflective resin is filled into the gap between the light-transmissive member and the light-shielding frame is facilitated.

Figure 13A:
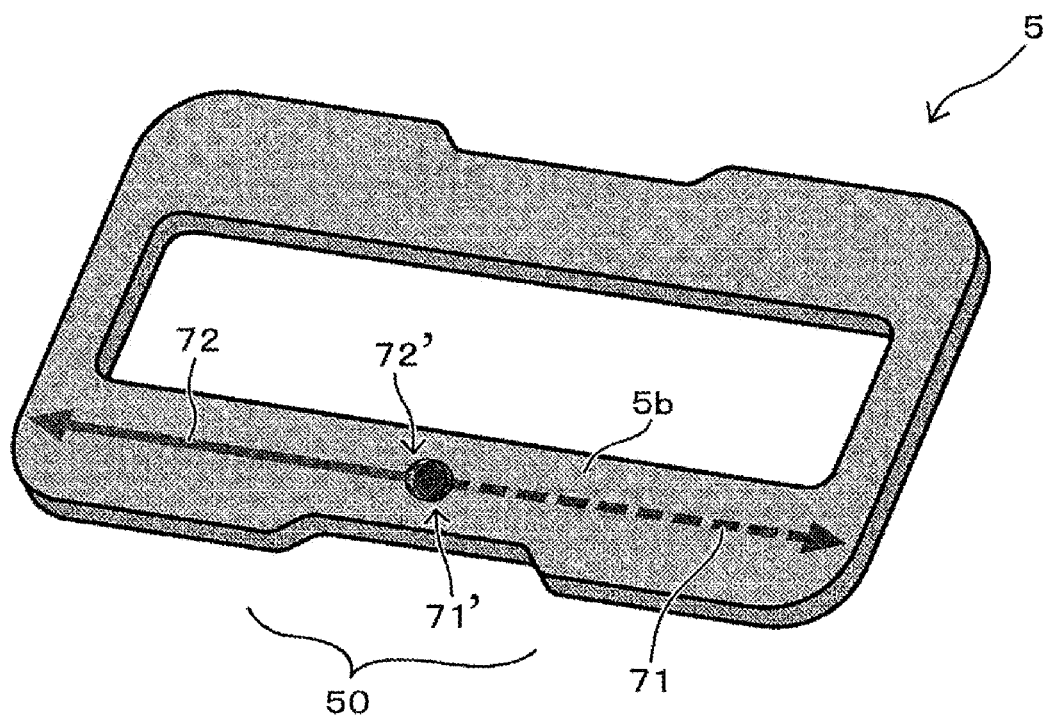
FIG. 13A is a schematic perspective view of an example of overlap applications on the narrow portion.
Figure 13B:
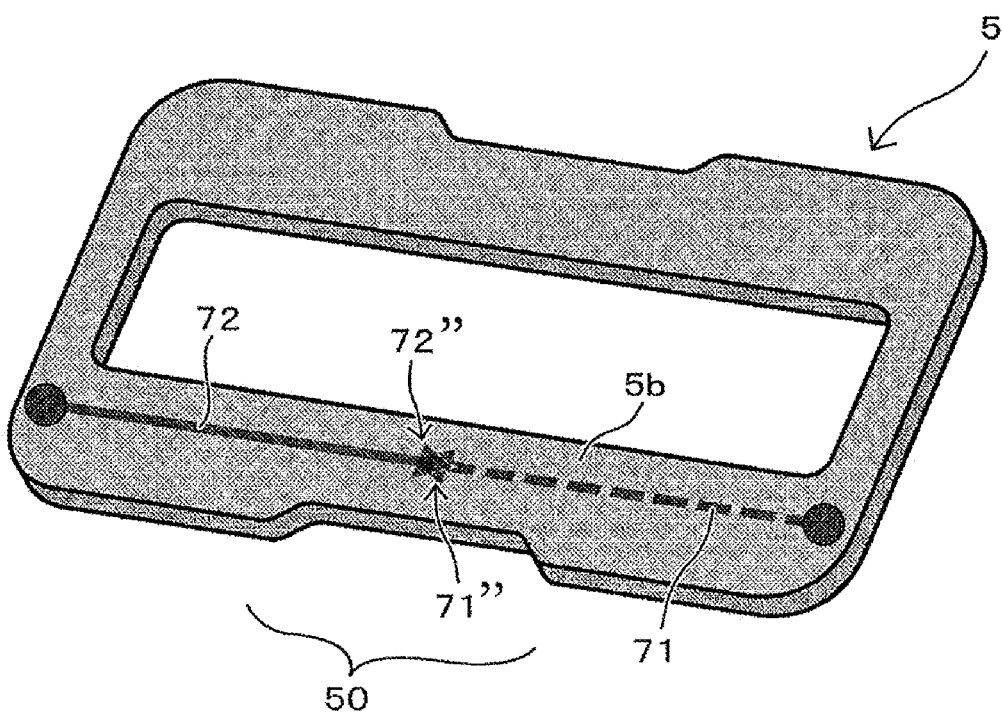
FIG. 13B is a schematic perspective view of an example of overlap applications on the narrow portion.
Figure 14A:
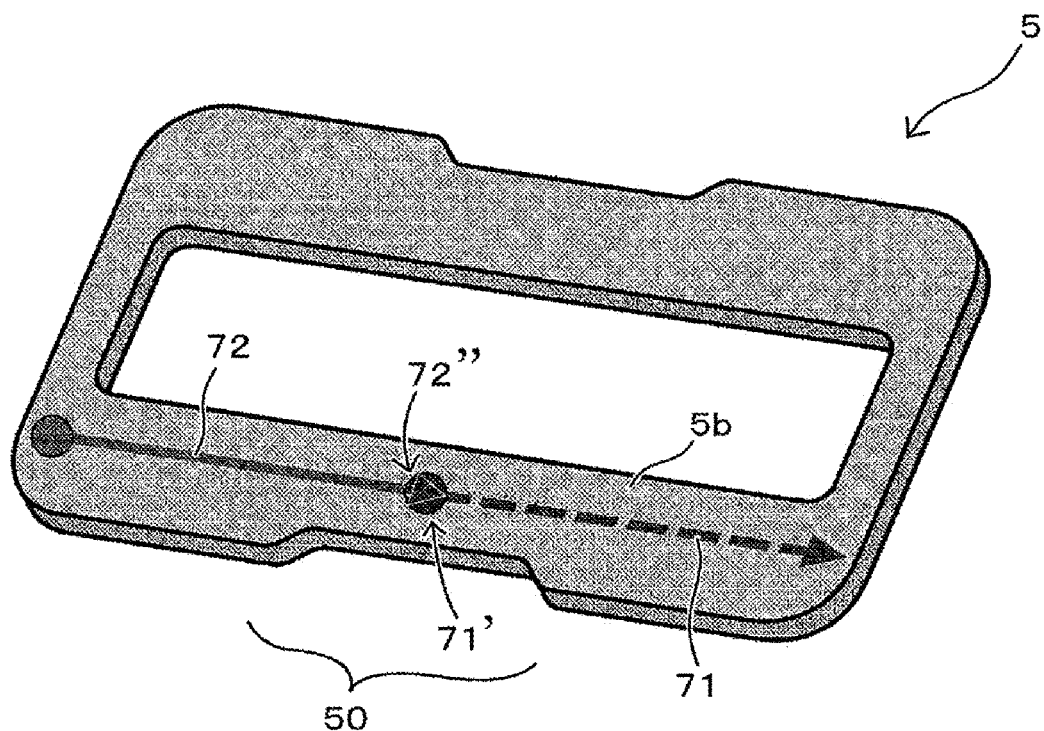
FIG. 14A is a schematic perspective view of an example of overlap applications on the narrow portion.
Figure 14B:
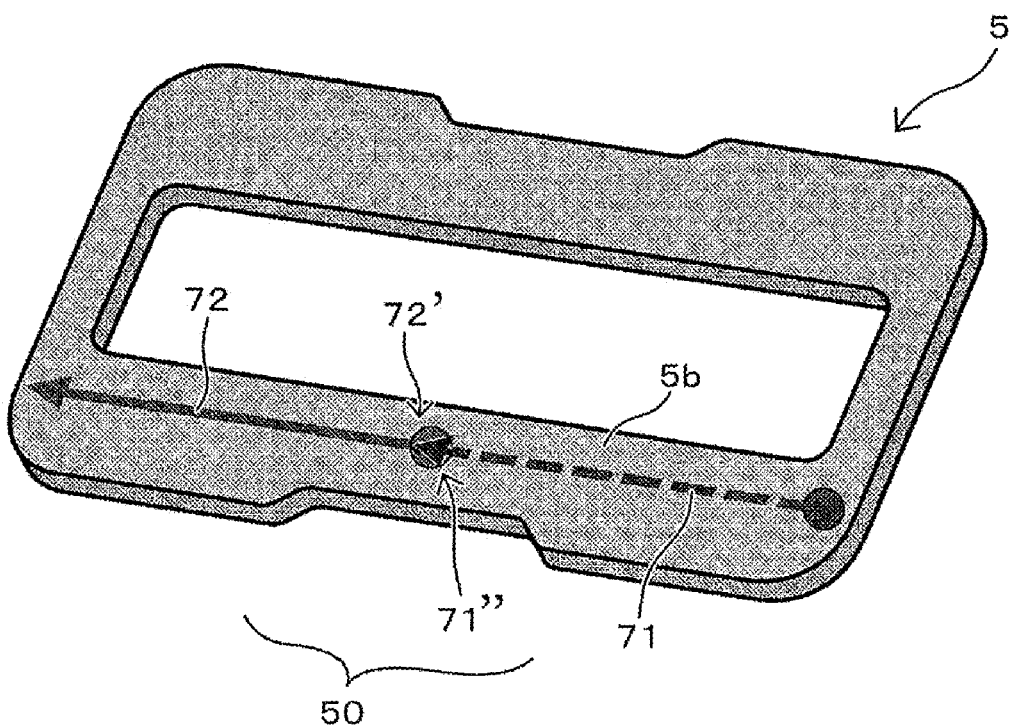
FIG. 14B is a schematic perspective view of an example of overlap applications on the narrow portion.

Substantially the same light-reflective resin can be used in the first application and the second application. The first application and the second application are preferably performed on "a side" including the narrow portion of the light-shielding frame. FIGS. 13A and 13B and FIGS. 14A and 14B schematically show various examples of the combination of the first application 71 and the second application 72. In FIG. 13A, the light-reflective resin is applied such that a starting point 71' of the first application 71 over the light-shielding frame 5 along the frame part 5b overlaps on the narrow portion 50 with a starting point 72' of the second application 72 over the light-shielding frame 5 along the frame part 5b. In FIG. 13B, the light-reflective resin is applied such that an end point 71" of the first application 71 over the light-shielding frame 5 along the frame part 5b overlaps on the narrow portion 50 with an end point 72" of the second application 72 over the light-shielding frame 5 along the frame part 5b. In FIG. 14A, the light-reflective resin is applied such that the starting point 71' of the first application 71 over the light-shielding frame 5 along the frame part 5b overlaps on the narrow portion 50 with the end point 72" of the second application 72 over the light-shielding frame 5 along the frame part 5b. In FIG. 14B, the light-reflective resin is applied such that the end point 71" of the first application 71 along the frame part 5b of the light-shielding frame 5 overlaps on the narrow portion 50 with the starting point 72' of the second application 72 along the frame part 5b of the light-shielding frame 5.

Figure 15:
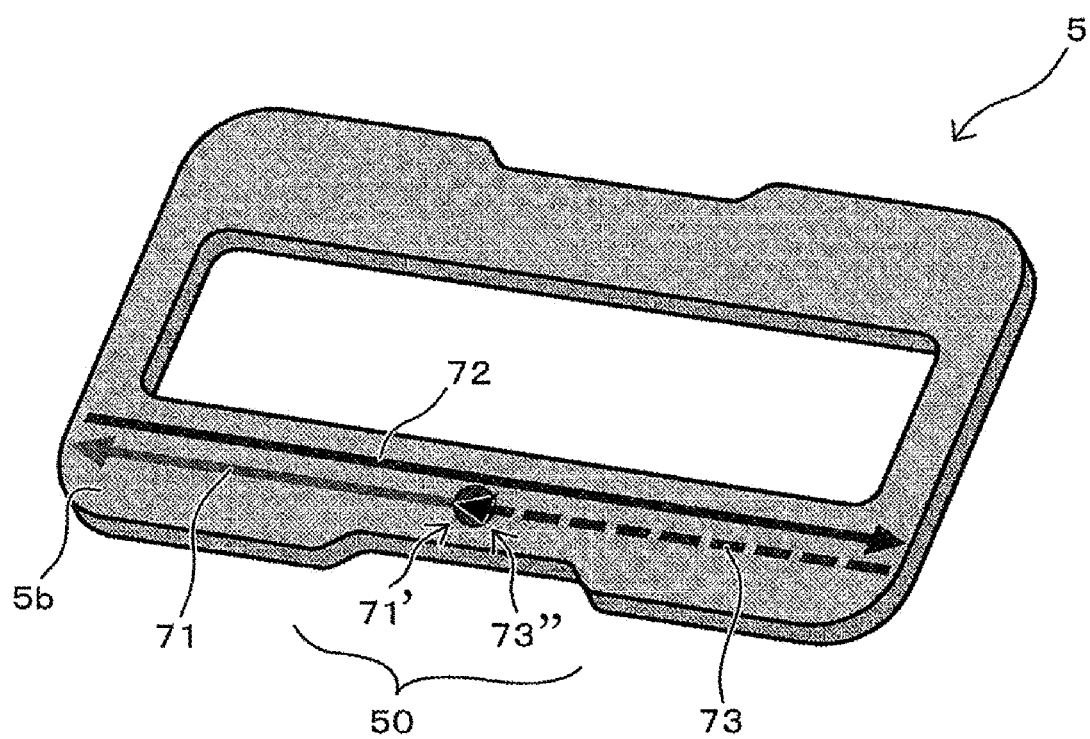
FIG. 15 is a schematic perspective view of an example of overlap applications on the narrow portion.

The application of the light-reflective resin is not limited to the first application and the second application but can include additional applications. For example, application of the light-reflective resin in the light-reflective resin application step can include the first application, the second application, and a third application. In such a case, the first application, the second application, and the third application can overlap with each other on the narrow portion. The light-reflective resin can be applied such that the starting point 71' of the first application 71 over the light-shielding frame 5 along the frame part 5b, part of the second application 72, and an end point 73″ of a third application 73 overlap with each other on the narrow portion 50 as shown in FIG. 15. The number of overlaps of applications on the narrow portion is greater than on the non-narrow portion also in this case, and therefore the top portion of the light-reflective resin is likely to be formed on the narrow portion. The first application 71, the second application 72, and the third application 73 can be performed as a single continuous application process in what is called a "unicursal or traversable" manner. That is, application can be performed such that the light-reflective resin is continuously and integrally formed on the light-shielding frame. This is because the efficiency of the process can be increased. Also in this case, the light-reflective resin application step includes the first application, the second application, and the third application. That is, application of the light-reflective resin in the light-reflective resin application step includes a first application, a second application in which the direction of movement of the nozzle differs from that in the first application, and a third application in which the direction of movement of the nozzle differs from that in the second application, the applications are continuously performed, and the light-reflective resin is continuously discharged from a resin discharging device in each application. The resin discharging device tends to discharge a larger amount of resin at the starting point and the end point of each application, but the height of the light-reflective resin in the non-narrow portion is likely to be kept low by not putting the starting point and the end point on the non-narrow portion.

Lastly, a method of forming the narrow portion is described. In the embodiment of the present disclosure, forming method the narrow portion of the light-shielding frame 5 is not particularly limited. For example, the "narrow portion" of the light-shielding frame 5 can be formed by etching. In this case, a light-shielding frame with a uniform lateral width of the frame part 5b can be obtained by a conventional method, and the light-shielding frame can be etched to form the narrow portion 50 in the frame part 5b. The narrow portion can be formed by machining such as pressing. That is, the narrow portion can be formed in the frame part 5b by cutting a region corresponding to the "recessed portion" from the light-shielding frame with a uniform lateral width of the frame part 5b. Alternatively, the opening 5a and the narrow portion can simultaneously formed in a plate-shaped light-shielding member by the above processing method.

Particularly in the case in which the narrow portion is formed by etching, the recessed portion in the narrow portion can have a contour that gradually narrows toward the inside of the frame part in a top view. For example, as shown in FIG. 3 or FIG. 4, in the case in which the outer contour of the light-shielding frame 5 is recessed and the narrow portion is formed, the contour of the recessed portion can gradually narrow in the direction from the outside of the light-shielding frame 5 to the opening 5a. That is, part of the outer contour of the narrow portion can be inclined or tapered in a top view. In the case in which the narrow portion is formed by etching, corners of the contour of the narrow portion tend to be rounded off.

Embodiments of the present disclosure has been described above, but the embodiments are merely examples. Accordingly, a person skilled in the art will easily understand that the present invention is not limited to the above embodiments, but rather can be embodied in various other configurations.

For example, the light-reflective resin application step has been described above, but the light-reflective resin does not necessarily have to be applied on all the sides of the light-shielding frame in the present disclosure. For example, in the case in which the light-shielding frame has a rectangular shape in a top view (i.e., in the case in which the frame part 5b has a rectangular shape in a top view), the light-reflective resin may be applied only over portions of the frame part 5b corresponding to the long sides. In this case, the light-reflective resin on the "long sides" flows toward the "short sides" when the light-reflective resin is applied over the light-shielding frame and/or when the light-reflective resin applied over the light-shielding frame is pressed with the flanges of the light-transmissive member so that the light-reflective resin flows into the gap between the light-transmissive member and the light-shielding frame. That is, the light-reflective resin on the long sides of the frame part is supplied into the gap between the light-transmissive member and the light-shielding frame while flowing toward the "short sides" of the frame part. In this configuration, narrow portions can be provided particularly only on the portions of the light-shielding frame corresponding to the "long sides."

The invention claimed is:

1. A method of manufacturing a light-emitting device, comprising:
    mounting a light-emitting element on a mounting board;
    placing a light-shielding frame on a sheet, the light-shielding frame defining an opening and comprising at least one narrow portion having a width that is smaller than that of another portion of the light-shielding frame in a top view;
    applying a light-reflective resin on at least the narrow portion of the light-shielding frame;
    forming a light-guiding supporting member, which comprises:
        providing a light-transmissive member having a plate shape and having a first surface and a second surface opposite to and larger than the first surface, the first surface having an outer perimeter that is smaller than an inner perimeter of the opening,
        disposing the light-transmissive member such that the first surface faces the sheet at a position proximate the opening, and
        forming a light-reflective member by bringing the light-transmissive member into contact with the light-reflecting resin disposed on the light-shielding frame, and pressing the light-transmissive member to allow the light-reflective resin to flow into a gap formed between the light-transmissive member and the light shielding frame, so as to form the light-guiding supporting member in which the light-shielding frame and the light-transmissive member are supported by the light-reflective member; and
    bonding the second surface of the light-transmissive member to an upper surface of the light-emitting element so as to fix the light-guiding supporting member on or above the light-emitting element.

2. The method of manufacturing a light-emitting device according to claim 1, wherein an outer contour of the light-shielding frame is recessed at the narrow portion.

3. The method of manufacturing a light-emitting device according to claim 1, wherein, in the step of applying the light-reflective resin, an uppermost portion of the light-reflective resin is located on the narrow portion.

4. The method of manufacturing a light-emitting device according to claim 3, wherein, in the step of forming the light-guiding supporting member, the light-reflective resin contacts with the light-transmissive member with a time lag because of a height of the light-reflective resin.

5. The method of manufacturing a light-emitting device according to claim 1, wherein the at least one narrow portion comprises first and second narrow portions that are positioned opposite each other.

6. The method of manufacturing a light-emitting device according to claim 1, wherein the narrow portion is positioned at a center of a longitudinal length of the light-shielding frame in a top view.

7. The method of manufacturing a light-emitting device according to claim 1,
   wherein, in the step of applying the light-reflective resin, the application of the light-reflective resin comprises at least a first application and a second application, and
   wherein the first application and the second application overlap with each other on the narrow portion.

\* \* \* \* \*